(12) United States Patent
Hasegawa et al.

(10) Patent No.: US 9,163,311 B2
(45) Date of Patent: Oct. 20, 2015

(54) FILM FORMING APPARATUS

(75) Inventors: Harunari Hasegawa, Nirasaki (JP); Kippei Sugita, Nirasaki (JP); Atsushi Ando, Nirasaki (JP); Yoshiki Fukuhara, Nirasaki (JP); Makoto Takahashi, Oshu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 711 days.

(21) Appl. No.: 13/333,137

(22) Filed: Dec. 21, 2011

(65) Prior Publication Data

US 2012/0180727 A1  Jul. 19, 2012

(30) Foreign Application Priority Data

Dec. 22, 2010  (JP) ................................ 2010-286405

(51) Int. Cl.
| | |
|---|---|
| *C23C 16/455* | (2006.01) |
| *C23C 16/458* | (2006.01) |
| *C23F 1/00* | (2006.01) |
| *H01L 21/306* | (2006.01) |
| *C23C 16/52* | (2006.01) |
| *C23C 16/06* | (2006.01) |
| *C23C 16/22* | (2006.01) |

(52) U.S. Cl.
CPC ......... *C23C 16/45578* (2013.01); *C23C 16/455* (2013.01); *C23C 16/458* (2013.01); *C23C 16/4584* (2013.01); *C23C 16/45563* (2013.01); *C23C 16/45576* (2013.01); *C23C 16/52* (2013.01)

(58) Field of Classification Search
CPC ............ C23C 16/45563; C23C 16/458; C23C 16/455; C23C 16/45576; C23C 16/45578
USPC .................. 118/715; 156/345.34, 345.51
See application file for complete search history.

(56) References Cited

U.S. PATENT DOCUMENTS

| | | | | | |
|---|---|---|---|---|---|
| 4,096,822 | A | * | 6/1978 | Yamawaki et al. | ........... 118/729 |
| 4,565,157 | A | * | 1/1986 | Brors et al. | ................... 118/719 |
| 4,684,542 | A | * | 8/1987 | Jasinski et al. | ................ 438/680 |
| 5,164,012 | A | * | 11/1992 | Hattori | ........................... 118/725 |
| 5,202,287 | A | * | 4/1993 | Joshi et al. | .................... 438/653 |
| 5,520,742 | A | | 5/1996 | Ohkase | |

(Continued)

FOREIGN PATENT DOCUMENTS

| | | | |
|---|---|---|---|
| JP | 61068393 A | * | 4/1986 |
| JP | 05-326422 A | | 12/1993 |

(Continued)

*Primary Examiner* — Rudy Zervigon
(74) *Attorney, Agent, or Firm* — Nath, Goldberg & Meyer; Jerald L. Meyer

(57) ABSTRACT

Provided is a film forming apparatus for forming a film on a substrate maintained within a film forming container by supplying a raw material gas to the substrate. The film forming container includes a substrate maintaining unit, a supply mechanism configured to include a supply pipe with supply holes formed thereon to supply a raw material gas to the interior of the film forming container through the supply holes, an exhaust mechanism configured to include an exhaust pipe with exhaust holes formed thereon to exhaust gas from the interior of the film forming container through the exhaust holes, and a controller configured to control the substrate maintaining unit, the supply mechanism, and the exhaust mechanism. The supply holes and the exhaust holes are formed to face each other with the substrate maintained in the substrate maintaining unit interposed therebetween.

6 Claims, 22 Drawing Sheets

(56) References Cited

U.S. PATENT DOCUMENTS

| | | | |
|---|---|---|---|
| 5,536,918 A | 7/1996 | Ohkase et al. | |
| 5,567,267 A * | 10/1996 | Kazama et al. | 156/345.27 |
| 5,725,664 A * | 3/1998 | Nanbu et al. | 118/52 |
| 5,956,859 A * | 9/1999 | Matsumoto et al. | 34/74 |
| 6,190,460 B1 * | 2/2001 | Hwang | 118/729 |
| 6,321,680 B2 * | 11/2001 | Cook et al. | 118/723 E |
| 6,352,594 B2 * | 3/2002 | Cook et al. | 118/724 |
| 6,881,295 B2 * | 4/2005 | Nagakura | 156/345.33 |
| D552,047 S * | 10/2007 | Sugawara | D13/182 |
| 7,622,007 B2 * | 11/2009 | Nakaiso | 118/725 |
| 8,071,477 B2 * | 12/2011 | Moriya et al. | 438/680 |
| 2001/0025605 A1 * | 10/2001 | Nagakura | 118/715 |
| 2004/0112290 A1 * | 6/2004 | Li et al. | 118/715 |
| 2005/0230892 A1 * | 10/2005 | Loo | 269/21 |
| 2008/0213478 A1 | 9/2008 | Matsuura | |
| 2009/0241834 A1 | 10/2009 | Kato | |
| 2009/0311807 A1 | 12/2009 | Yamaga et al. | |
| 2010/0151682 A1 * | 6/2010 | Moriya et al. | 438/680 |
| 2010/0218724 A1 * | 9/2010 | Okada | 118/724 |
| 2010/0275848 A1 * | 11/2010 | Fukuda et al. | 118/728 |
| 2011/0039420 A1 | 2/2011 | Nakao et al. | |
| 2011/0186984 A1 * | 8/2011 | Saito et al. | 257/734 |
| 2012/0100722 A1 * | 4/2012 | Asai et al. | 438/758 |
| 2012/0160169 A1 * | 6/2012 | Hasegawa et al. | 118/725 |
| 2012/0180727 A1 * | 7/2012 | Hasegawa et al. | 118/730 |
| 2012/0199067 A1 * | 8/2012 | Morozumi et al. | 118/719 |
| 2013/0167774 A1 * | 7/2013 | Yang et al. | 118/728 |

FOREIGN PATENT DOCUMENTS

| | | |
|---|---|---|
| JP | 10-306373 A | 11/1998 |
| JP | 2000-021866 A | 1/2000 |
| JP | 2000-311862 A | 11/2000 |
| JP | 2003-347047 A | 12/2003 |
| JP | 2009-081259 A | 4/2009 |
| JP | 4283910 B2 | 6/2009 |
| JP | 2010-153467 A | 8/2010 |
| JP | 2010-219145 A | 9/2010 |

\* cited by examiner

FILM FORMING APPARATUS

CROSS-REFERENCE TO RELATED APPLICATION

This application claims the benefit of Japanese Patent Application No. 2010-286405, filed on Dec. 22, 2010, in the Japan Patent Office, the disclosure of which is incorporated herein in its entirety by reference.

TECHNICAL FIELD

The present disclosure relates to a film forming apparatus for forming a film on a substrate.

BACKGROUND

Recently, material used for a semiconductor device has extended from inorganic material to organic material, and the characteristics of a semiconductor device or a fabrication process can be further optimized by using the special characteristics of the organic material, which are not present in the inorganic material.

One such organic material is polyimide. Polyimide has high adhesion and low leakage current. Thus, a polyimide film obtained by forming polyimide on a surface of a substrate may be used as an insulating layer, and may also be used as an insulating layer in a semiconductor device.

As a method for forming such a polyimide film, there is known a film forming method based on deposition polymerization using, for example, pyromellitic dianhydride (hereinafter, abbreviated as "PMDA") and 4,4'-diaminodiphenylether including, for example, 4,4'-oxydianiline (hereinafter, abbreviated as "ODA") as raw material monomers. The deposition polymerization is a method for thermally polymerizing PMDA and ODA used as raw material monomers on a surface of a substrate. In the related art, there is disclosed a film forming method for forming a polyimide film by evaporating the monomers of PDMA and ODA with a carburetor, supplying the evaporated vapor of each of the PDMA and ODA to a deposition polymerization chamber, and deposition-polymerizing the same on the substrate.

In order to form a polyimide film having excellent film quality by using deposition polymerization at a low cost and within a short time, it is required to continuously supply a fixed amount of vaporized PMDA (hereinafter, referred to as "PMDA gas") and the vaporized ODA (hereinafter, referred to as "ODA gas") to the substrate. Thus, a film forming apparatus for forming a polyimide film preferably includes a supply mechanism for supplying raw material gases composed of the PMDA gas and the ODA gas into a film forming container and an exhaust mechanism for exhausting gases from the film forming container to decompress the interior of the film forming container.

However, a film forming apparatus for forming a polyimide film by supplying the PMDA gas and the ODA gas to the substrate has the following problems.

In order to form a polyimide film on the surface of the substrate by supplying the raw material gases composed of the PMDA gas and the ODA gas, the supply amount of the raw material gases within the plane of the substrate is preferably uniform, and to this end, the flow of the raw material gases on the surface of the substrate is preferably a laminar flow. However, the flow of the raw material gases on the surface of the substrate that is generated as the raw material gases are supplied into the film forming container by the supply mechanism and as the gases are exhausted from the interior of the film forming container by the exhaust mechanism is not a laminar flow, degrading the uniformity of the supply amount of the raw material gases within the plane of the substrate. In addition, besides a film thickness of the formed film, the uniformity of film quality is also degraded.

SUMMARY

According to one aspect of the present disclosure, there is provided a film forming apparatus for forming a film on a substrate maintained within a film forming container by supplying a raw material gas to the substrate. The film forming apparatus comprises: a substrate maintaining unit configured to rotatably maintain the substrate within a horizontal plane within the film forming container; a supply mechanism installed within the film forming container, and configured to include a supply pipe with supply holes formed thereon to supply a raw material gas to the interior of the film forming container through the supply holes; an exhaust mechanism installed within the film forming container, and configured to include an exhaust pipe with exhaust holes formed thereon to exhaust gas from the interior of the film forming container through the exhaust holes; and a controller configured to control the substrate maintaining unit, the supply mechanism, and the exhaust mechanism. The supply holes and the exhaust holes are formed to face each other with the substrate maintained in the substrate maintaining unit interposed therebetween, and the controller provides control to form a film on the substrate by supplying the raw material gas by the supply mechanism and, at the same time, exhausting the gas by the exhaust mechanism in a state in which the substrate maintained in the substrate maintaining unit is rotated.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

A first embodiment of the present disclosure will now be described in detail with reference to the drawings.
First Embodiment First, a film forming apparatus according to a first embodiment of the present disclosure will be described with reference to FIGS. 1 to 6. The film forming apparatus according to the present embodiment is applicable to a film forming apparatus for forming a polyimide film on a substrate by supplying a first raw material gas obtained by vaporizing, for example, pyromellitic dianhydride (PMDA), and a second raw material gas obtained by vaporizing, for example, 4, 4'-3 oxydianiline (ODA) to the substrate maintained within a film forming container.

Figure 1:
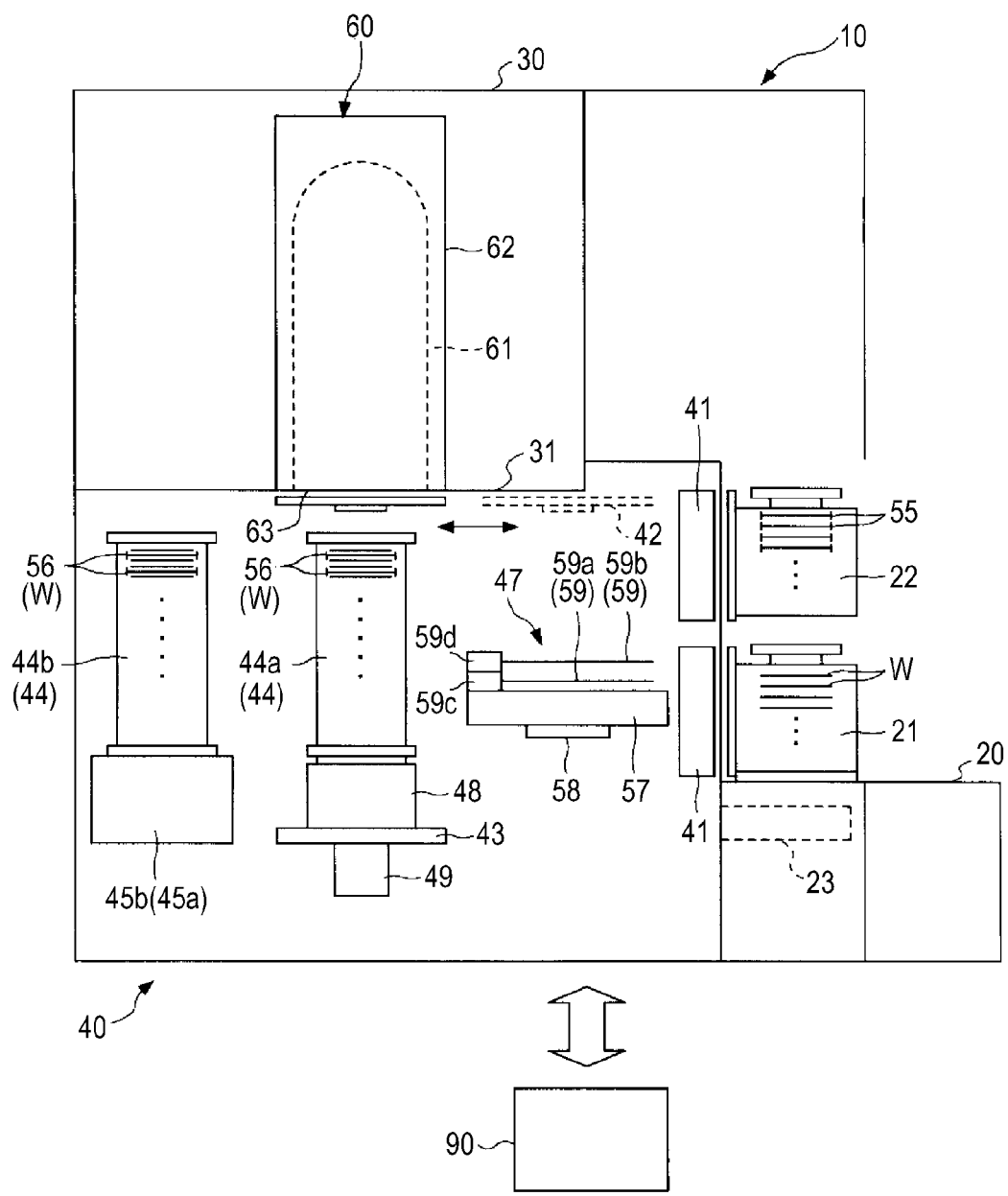
FIG. 1 is a vertical sectional view schematically showing a film forming apparatus according to a first embodiment of the present disclosure.
Figure 2:
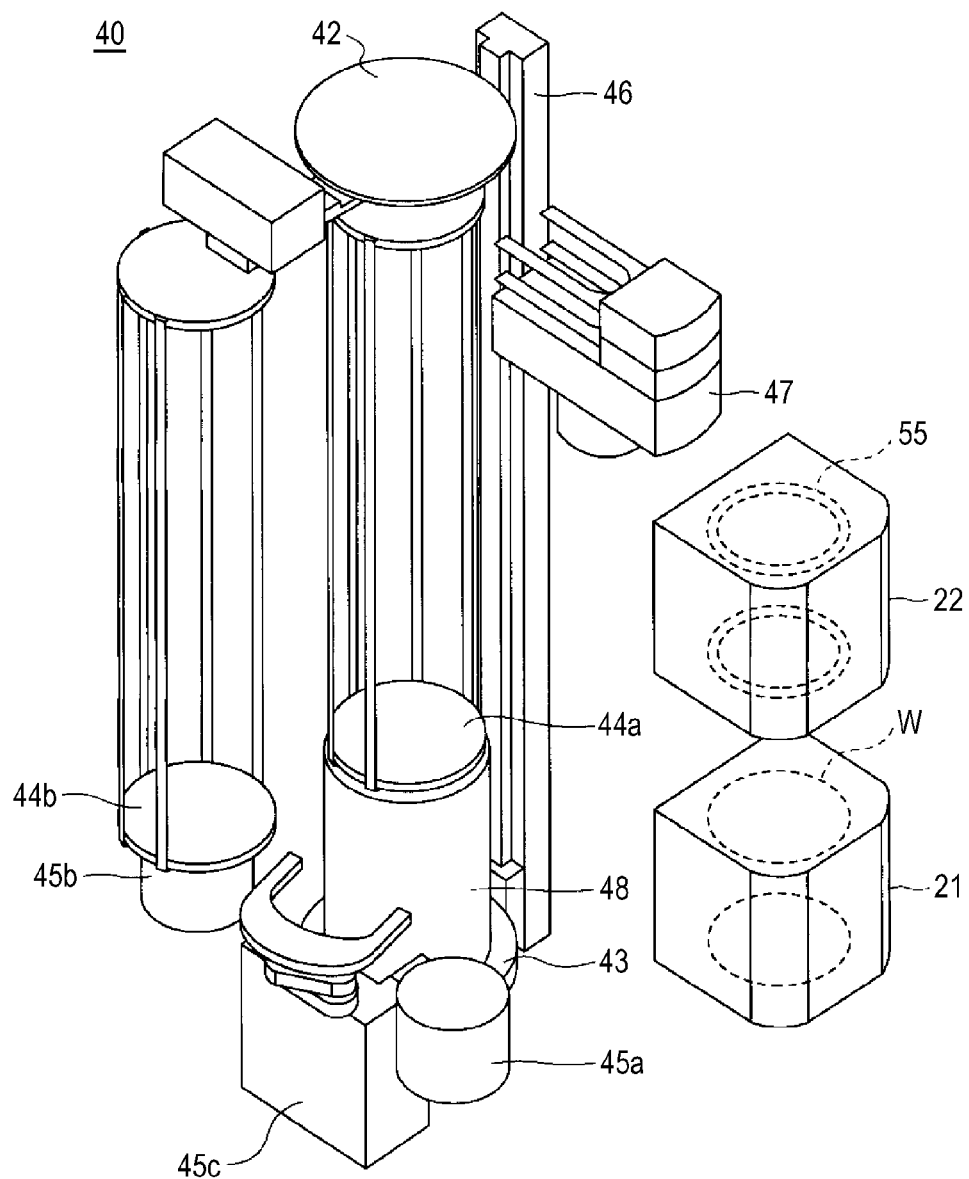
FIG. 2 is a perspective view schematically showing a loading area.
Figure 3:
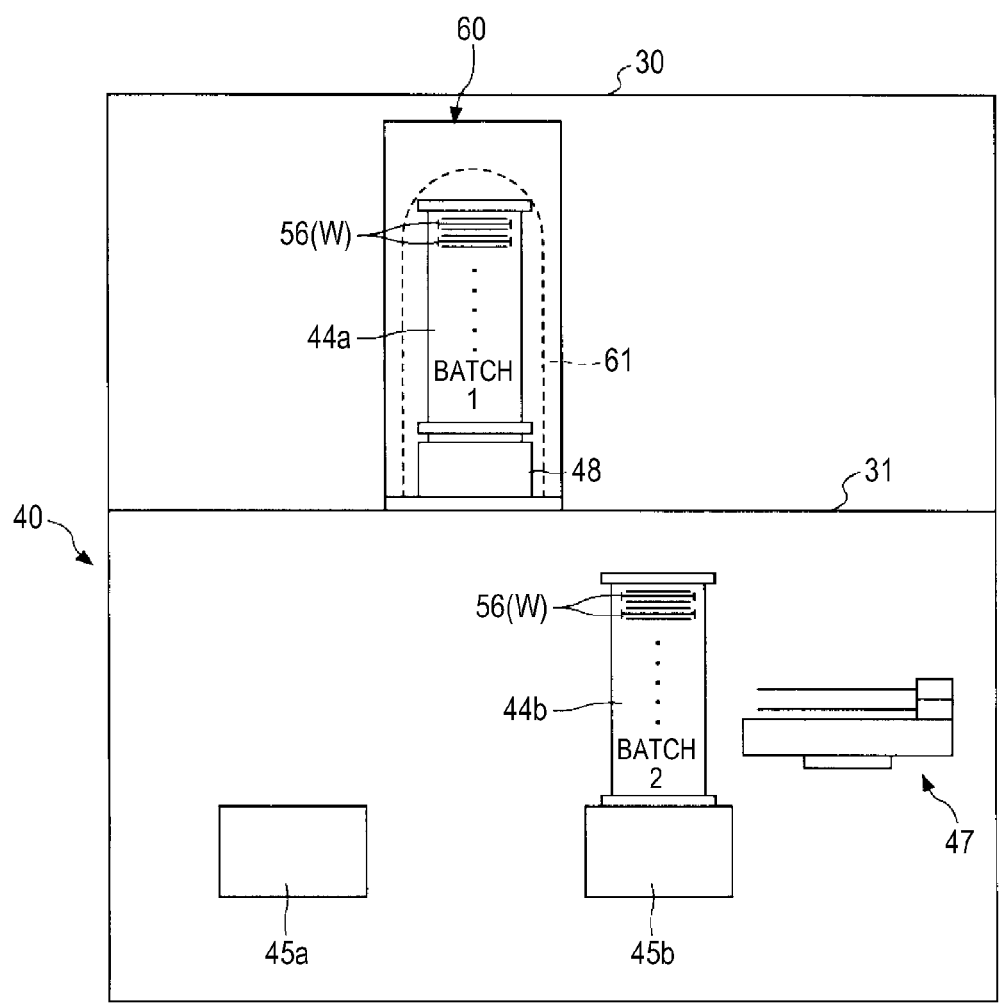
FIG. 3 is a view showing a state of a wafer W of a rear batch when a wafer W of a front batch is formed within a film forming container.
Figure 4:
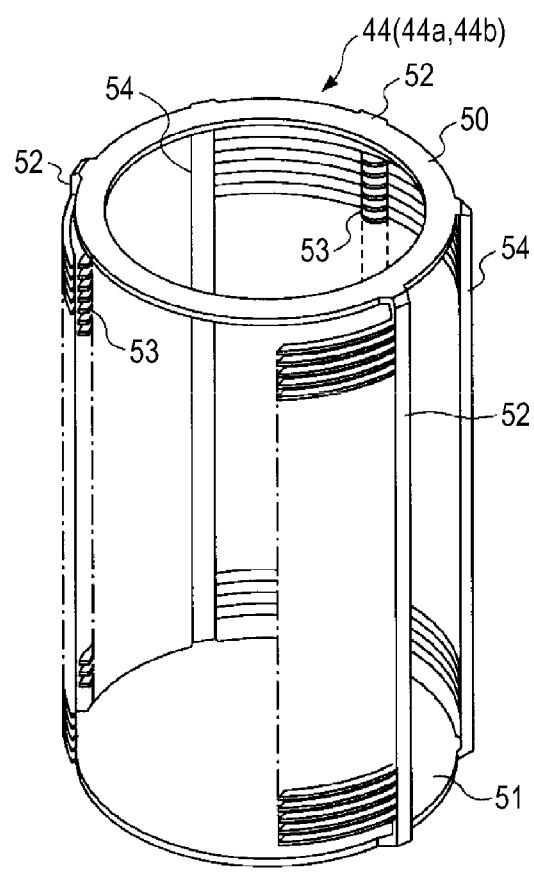
FIG. 4 is a perspective view schematically showing an example of a boat.
Figure 5:
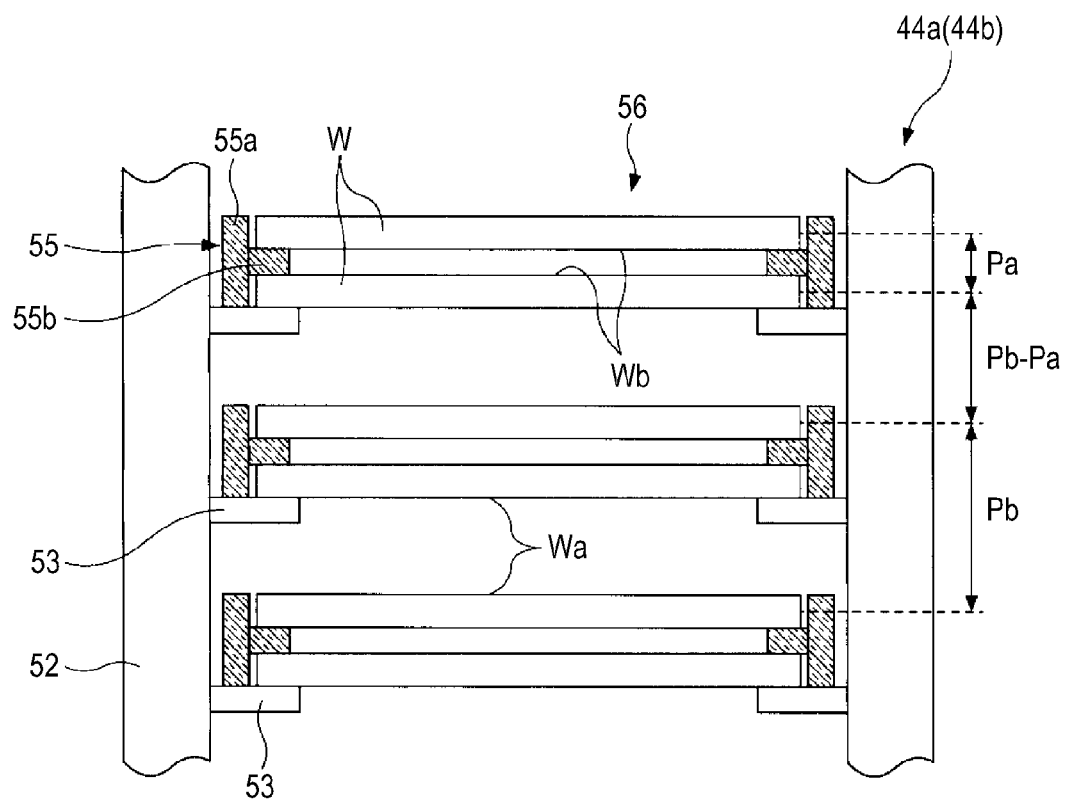
FIG. 5 is a sectional view showing a state in which a double-plate unit is mounted in the boat.
Figure 6:
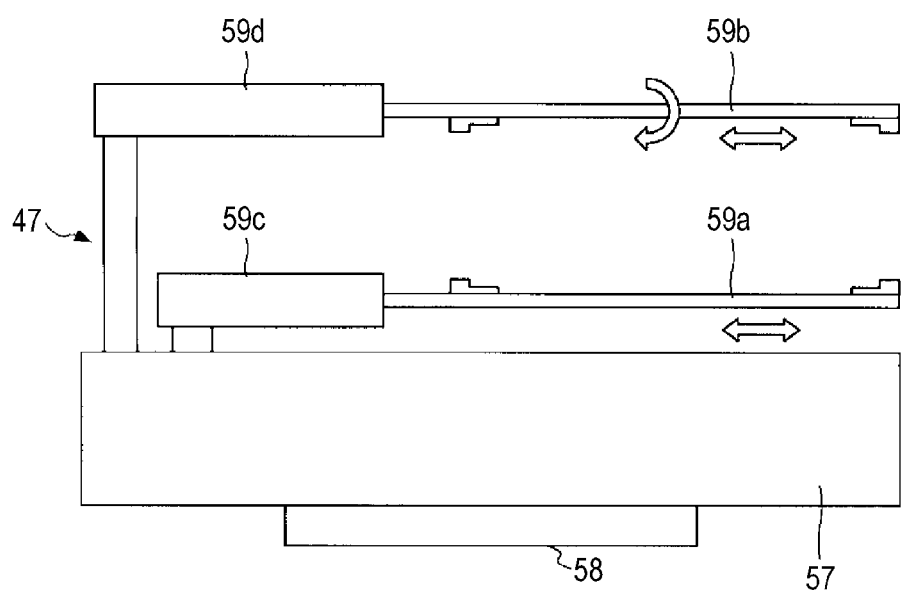
FIG. 6 is a side view schematically showing an example of a movement mounting mechanism.

FIG. 1 is a vertical sectional view schematically showing a film forming apparatus 10 according to the present embodiment. FIG. 2 is a perspective view schematically showing a loading area 40 illustrated in FIG. 1. FIG. 3 is a view showing a state of a wafer W of a rear batch (batch 2) when a wafer W of a front batch (batch 1) is formed within a film forming container. FIG. 4 is a perspective view schematically showing an example of a boat 44. FIG. 5 is a sectional view showing a state in which a double-plate unit 56 is mounted in the boat 44. FIG. 6 is a side view schematically showing an example of a movement mounting mechanism 47.

The film forming apparatus 10 has a loading table (load port) 20, a housing 30, and a controller 90.

The loading table (load port) 20 is installed at a front portion of the housing 30. The housing 30 has a loading area (operation area) 40 and a film forming container 60. The loading area 40 is installed at a lower portion within the housing 30, and the film forming container 60 is installed above the loading area 40 within the housing 30. In addition, a base plate 31 is formed between the loading area 40 and the film forming container 60. Also, a supply mechanism 70 (to be described later) is installed to be connected with the film forming container 60.

The base plate 31 is a base plate made of, for example, SUS, for installing a reaction tube 61 (to be described later) of the film forming container 60, and includes an opening (not shown) for allowing the reaction tube 61 to be upwardly inserted from a lower side.

The loading table (load port) 20 is to load or unload a wafer W into or from the housing 30. The loading table (load port) 20 has a receiving container 21 mounted thereon. The receiving container 21 is an airtight receiving container (hoop) having a cover (not shown) detachably attached to a front side thereof, in which a plurality of sheets of wafers W, for example, about 50 sheets of wafers W, can be received at certain intervals.

Also, in the present embodiment, the loading table (load port) 20 may serve to load or unload support rings 55 (to be described later) into or from the housing 30. A receiving container 22 may be mounted on the loading table (load port) 20. The receiving container 22 is an airtight receiving container (hoop) having a cover (not shown) detachably attached to a front side thereof, in which a plurality of sheets of support rings 55 (to be described later), for example, about 25 sheets of support rings 55, can be received at certain intervals.

Also, an alignment device (aligner) 23 for aligning cutout portions (e.g., notches) formed on an outer circumference of the wafers W, which have been moved and mounted by a movement mounting mechanism 47 (to be described later), in one direction may be installed at a lower side of the loading table 20.

The loading area (operation area) 40 serves to movably mount a wafer W between the receiving container 21 and a boat 44 (to be described later) and load the boat 44 into the film forming container 60, and unload the boat 44 from the film forming container 60. A door mechanism 41, a shutter mechanism 42, a cover 43, the boat 44, bases 45a and 45b, a lifting mechanism 46, and the movement mounting mechanism 47 are installed in the loading area 40.

Also, the cover 43 and the boat 44 correspond to a substrate maintaining unit in the present disclosure.

The door mechanisms 41 remove the covers of the receiving containers 21 and 22 to allow the interiors of the receiving containers 21 and 22 to communicate with the interior of the loading area 40.

The shutter mechanism 42 is installed at an upper portion of the loading area 40. The shutter mechanism 42 is installed to cover (or shut) an opening 63 of the film forming container 60 (to be described later) in order to restrain or prevent heat within a high temperature furnace from being discharged to the loading area 40 from the opening 63 when the cover 43 is not covering the opening 63.

The cover 43 has a warming container 48 and a rotary mechanism 49. The warming container 48 is installed on the cover 43. The warming container 48 serves to keep the boat 44 warm by preventing the boat 44 from being cooled by heat transfer with the cover 43. The rotary mechanism 49 is installed at a lower portion of the cover 43. The rotary mechanism 49 rotates the boat 44. A rotational shaft of the rotary mechanism 49 is installed to airtightly penetrate the cover 43 to rotate a rotary table (not shown) disposed on the cover 43.

As shown in FIG. 2, the lifting mechanism 46 lifts or lowers the cover 43 when the boat 44 is loaded into the film forming container 60 from the loading area 40 or unloaded therefrom. In addition, when the cover 43 lifted by the lifting mechanism 46 is loaded within the film forming container 60, the cover 43 contacts with the opening 63 (to be described later) to hermetically close the opening 63. Further, the boat 44 loaded on the cover 43 is able to rotatably maintain the wafer W within a horizontal plane within the film forming container 60.

Also, the film forming apparatus 10 may have a plurality of boats 44. Hereinafter, in the present embodiment, a case in which two boats 44 are provided will be described with reference to FIG. 2.

Boats 44a and 44b are installed in the loading area 40. Also, the bases 45a and 45b and a boat transfer mechanism 45c are installed in the loading area 40. The bases 45a and 45b are load ports to which the boats 44a and 44b are moved from the cover 43 to be mounted thereon. The boat transfer mechanism 45c serves to move the boats 44a and 44b to the bases 45a and 45b from the cover 43 to be mounted thereon.

As shown in FIG. 3, while the boat 44a with wafers W of a front batch (batch 1) mounted thereon is loaded into the film forming container 60 and a film is formed, wafers W of a rear batch (batch 2) may be moved and mounted from the receiving container 21 to the boat 44b in the loading area 40. Accordingly, when the film formation process of the wafers W of the front batch (batch 1) is terminated, the boat 44b with the wafers W of the batch (batch 2) mounted thereon can be loaded into the film forming container 60 immediately after the boat 44a is unloaded from the film forming container 60. As a result, a time (tact time) required for film formation processing can be shortened to reduce fabrication costs.

The boats 44a and 44b may be made of, for example, quartz, and wafers having a large diameter, for example, wafers W having a diameter of 300 mm, may be mounted at certain intervals (pitch width) in a vertical direction in a horizontal state. As shown in FIG. 4, the boats 44a and 44b are formed by interposing a plurality of pillars, for example, three pillars 52, between a ceiling plate 50 and a bottom plate 51. A hook portion 53 for maintaining wafers W may be installed on the pillars 52. Also, auxiliary columns 54 may be appropriately installed along with the pillars 52.

Also, as shown in FIG. 5, with regard to the boats 44a and 44b, a plurality of wafers W may be maintained in a vertical direction such that they vertically neighbor with rear surfaces Wb facing each other or with surfaces Wa facing each other. At the same time, the interval between two sheets of wafers W, which vertically neighbor with rear surfaces Wb facing each other is narrower than the interval between two sheets of wafers W which vertically neighbor with surfaces Wa facing each other. Hereinafter, for the present embodiment, an example in which the wafers W that vertically neighbor each other are mounted on the boats 44a and 44b such that their rear surfaces Wb face each other through a support ring 55 will be described.

A double-plate unit 56 configured to support two sheets of wafers W may be maintained on the hook portions 53 of the boats 44a and 44b. The double-plate unit 56 supports the two sheets of wafers W such that the rear surfaces Wb thereof face each other by supporting circumferential portions of the wafers W by the support ring 55. It is assumed that the interval of the two sheets of wafers W supported such that the rear surfaces Wb thereof face each other in one double-plate unit 56 is Pa and the interval at which the double-plate units 56 are maintained in the vertical direction, namely, the interval between the hook portions 53 is Pb. At this time, the interval of two sheets of wafers W that neighbor vertically with surfaces Wa thereof facing each other is Pb-Pa. In this arrangement, preferably, Pa is smaller than Pb-Pa. Namely, it is preferred that a plurality of wafers W are maintained in the vertical direction such that the interval Pa of the two sheets of wafers W that vertically neighbor with the rear surfaces Wb facing each other is narrower than the interval Pb-Pa of the two sheets of wafers W that vertically neighbor with the surfaces Wa thereof facing each other.

The support ring 55 includes a circular ring portion 55a having an inner diameter which is equal to or slightly greater than the wafer W and a spacer portion 55b installed at the center along an inner circumference of the circular ring portion 55a, excluding upper and lower end portions of the circular ring portion 55a, to form the interval between two sheets of wafers W. The spacer portion 55b serves to seal the gap between the two sheets of wafers W that vertically neighbor with rear surfaces Wb thereof facing each other when a film is formed within the film forming container 60. Also, the spacer portion 55b serves to prevent a raw material gas from being introduced to the gap between two sheets of wafers W that vertically neighbor with rear surfaces Wb thereof facing each other and a film from being formed on the rear surface Wb of the wafer W. The support ring 55 may be made of, for example, quartz.

Further, the spacer portion 55b of the support ring 55 corresponds to a blocking member in the present embodiment.

As shown in FIG. 5, the wafer W with a rear surface Wb as an upper surface (namely, the surface Wa as a lower surface) is supported on the hook portion 53. The support ring 55 is supported by the hook portion 53 in a state in which a lower surface of the circular ring portion 55a is in contact with the hook portion 53. Also, the wafer W with the rear surface Wb as a lower surface (namely, the surface Wa as an upper surface) is supported on the spacer portion 55b of the support ring 55.

Here, in one double-plate unit 56, the interval Pa between two sheets of wafers W supported such that rear surfaces Wb thereof face each other may be, for example, 2 mm, and the interval Pb at which the double-plate unit 56 is maintained in the vertical direction (interval between the hook portions 53) may be, for example, 11 mm. Then, the interval Pb-Pa of two sheets of wafers W that vertically neighbor with surfaces Wa thereof facing each other may be 9 mm. However, assuming that the wafers W are supported such that the interval between two neighboring wafers W in the plurality of wafers W is equal without changing the number of wafers mounted on the boat 44, the interval between two sheets of wafers W that vertically neighbor is 5.5 mm, half of 11 mm, which is smaller than 9 mm. Thus, according to the present embodiment, since the wafers W are supported such that the rear surfaces Wb thereof face each other by using the double-plate unit 56, the gap between the surface Wa of one wafer W and the surface Wa of the other wafer W can be increased, so that a sufficient amount of raw material gas can be supplied to the surface Wa of the wafer W.

The movement mounting mechanism 47 serves to move and mount the wafers W or the support ring 55 between the receiving containers 21 and 22 and the boats 44a and 44b. The movement mounting mechanism 47 includes a base 57, a lifting arm 58, and a plurality of forks (movement mounting plates) 59. The base 57 is installed to be lifted and lowered and to gyrate. The lifting arm 58 is installed to be movable (liftable) in a vertical direction by a ball thread, or the like, and the base 57 is installed to horizontally gyrate on the lifting arm 58.

Also, for example, the movement mounting mechanism 47 may have a lower fork 59a which can be horizontally moved and an upper fork 59b which can be horizontally moved and vertically flipped. An example of the movement mounting mechanism 47 is illustrated in the side view of FIG. 6.

The lower fork 59a is installed to move to and from the boats 44a and 44b for mounting the double-plate unit 56 thereon by a moving body 59c, and to transfer the double-plate unit 56 to and from the boats 44a and 44b. Meanwhile, the upper folk 59b is installed to be horizontally moved by the moving body 59d and to move to and from the receiving container 21 that receives the wafers W, and to transfer the wafers W to and from the receiving container 21. Also, the upper fork 59b is installed to move to and from the receiving container 22 that receives the support ring 55 by the moving body 59d and to transfer the support ring 55 to and from the receiving container 22.

Further, the movement mounting mechanism 47 may have a plurality of sheets of lower forks 59a and a plurality of sheets of upper forks 59b.

Figure 7:
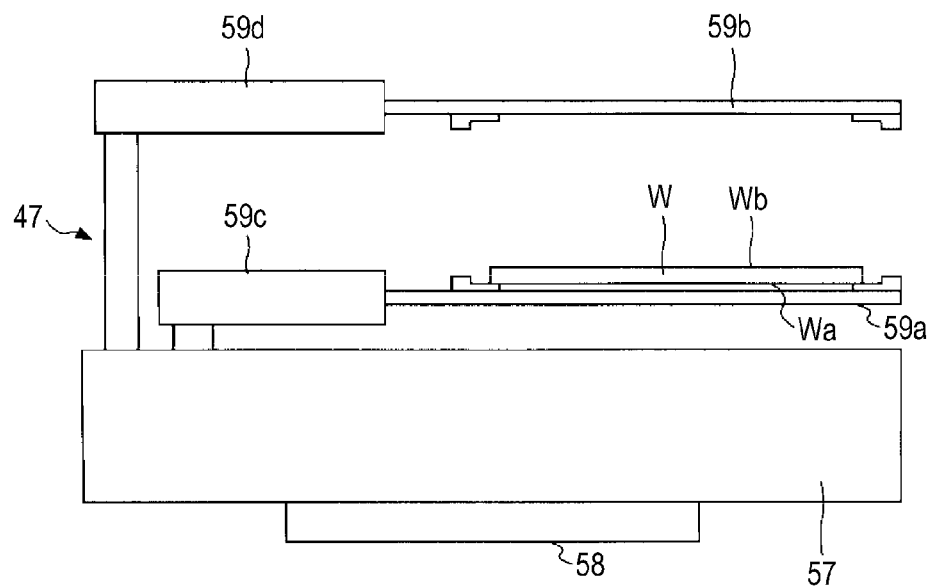
FIG. 7 is a first side view illustrating the order in which the movement mounting mechanism configures the double-plate unit and transfers it.
Figure 8:
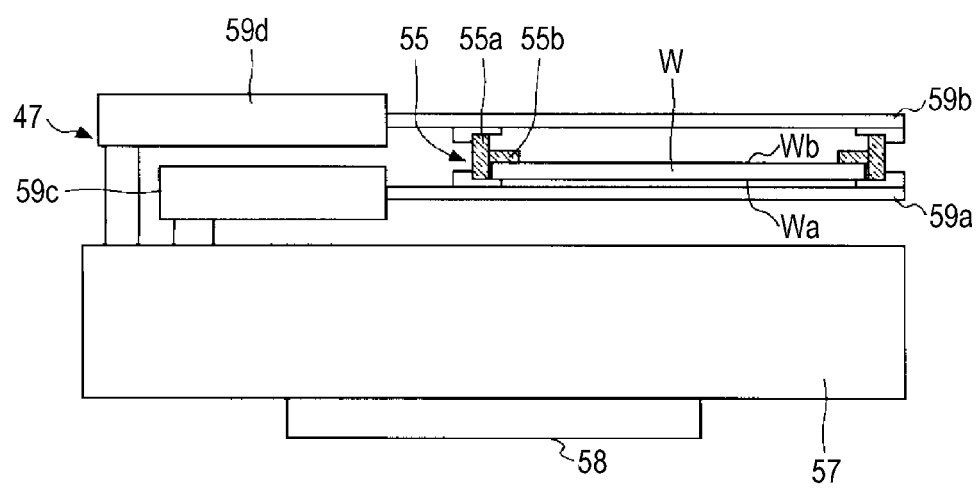
FIG. 8 is a second side view illustrating the order in which the movement mounting mechanism configures the double-plate unit and transfers it.
Figure 9:
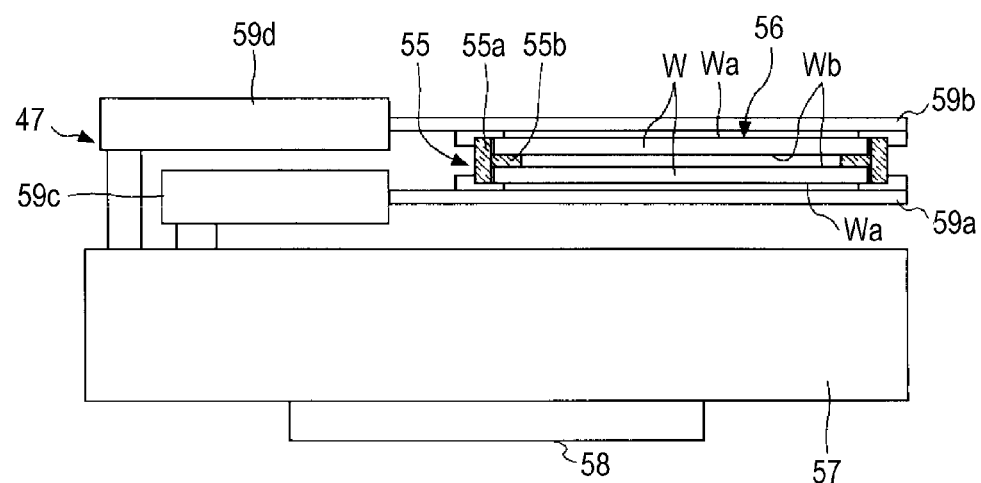
FIG. 9 is a third side view illustrating the order in which the movement mounting mechanism configures the double-plate unit and transfers it.

FIGS. 7 to 9 are side views showing the order in which the movement mounting mechanism 47 configures the double-plate unit 56 and performs transferring. First, the upper fork 59b moves into the receiving container 21, takes the wafer W received in the receiving container 21, moves back from the interior of the receiving container 21, is vertically flipped while maintaining the wafer W, and transfers the wafer W as a lower wafer W to the lower fork 59a (FIG. 7). Next, the upper fork 59b in the vertically flipped state moves to the receiving container 22, takes the support ring 55 received in the receiving container 22, moves back from the interior of the receiving container 22, and loads the support ring 55 on the lower wafer W maintained by the lower fork 59a (FIG. 8). Then, the upper fork 59b in the vertically flipped state moves into the receiving container 21, takes the wafer W received in the receiving container 21, moves back from the interior of the receiving container 21, and loads the wafer W as an upper wafer W on the support ring 55 maintained by the lower fork 59a (FIG. 9).

Figure 10:
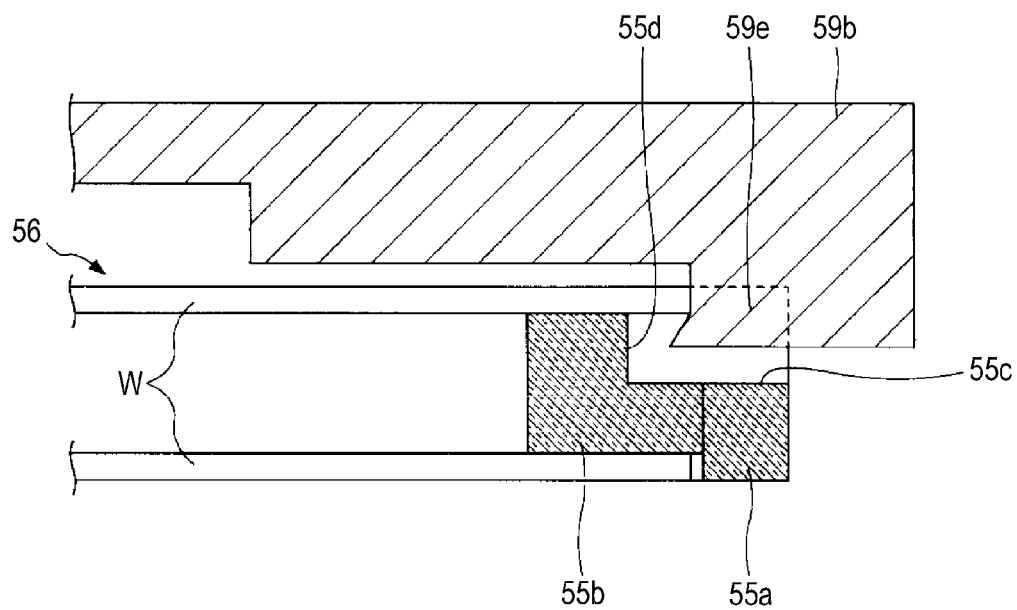
FIG. 10 is an enlarged sectional view of a portion in which an upper fork grasps an upper wafer W when a lower fork has two sheets of wafers W mounted thereon through a support ring.

FIG. 10 is an enlarged sectional view of a portion in which the upper fork 59b grasps the upper wafer W when the lower fork 59a has two sheets of wafers W mounted thereon through the support ring 55. The illustration of the lower fork 59a is omitted in FIG. 10.

The circular ring portion 55a and the spacer portion 55b constitute the support ring 55, and as shown in FIG. 10, cutout portions 55c and 55d may be formed at a portion having the possibility of being in contact with the support ring 55 when the upper fork 59b loads the second sheet of wafer W to thus prevent interference with the hook portion 59e of the upper fork 59b. However, even at the portions where the cutout portions 55c and 55d are formed, the spacer portion 55b is preferably installed to block the gap between the two sheets of wafers W. Accordingly, a raw material gas can be reliably prevented from being introduced between the two sheets of wafers W mounted such that rear surfaces Wb thereof face each other and from forming a film on the rear surface Wb of the wafer W.

Figure 11:
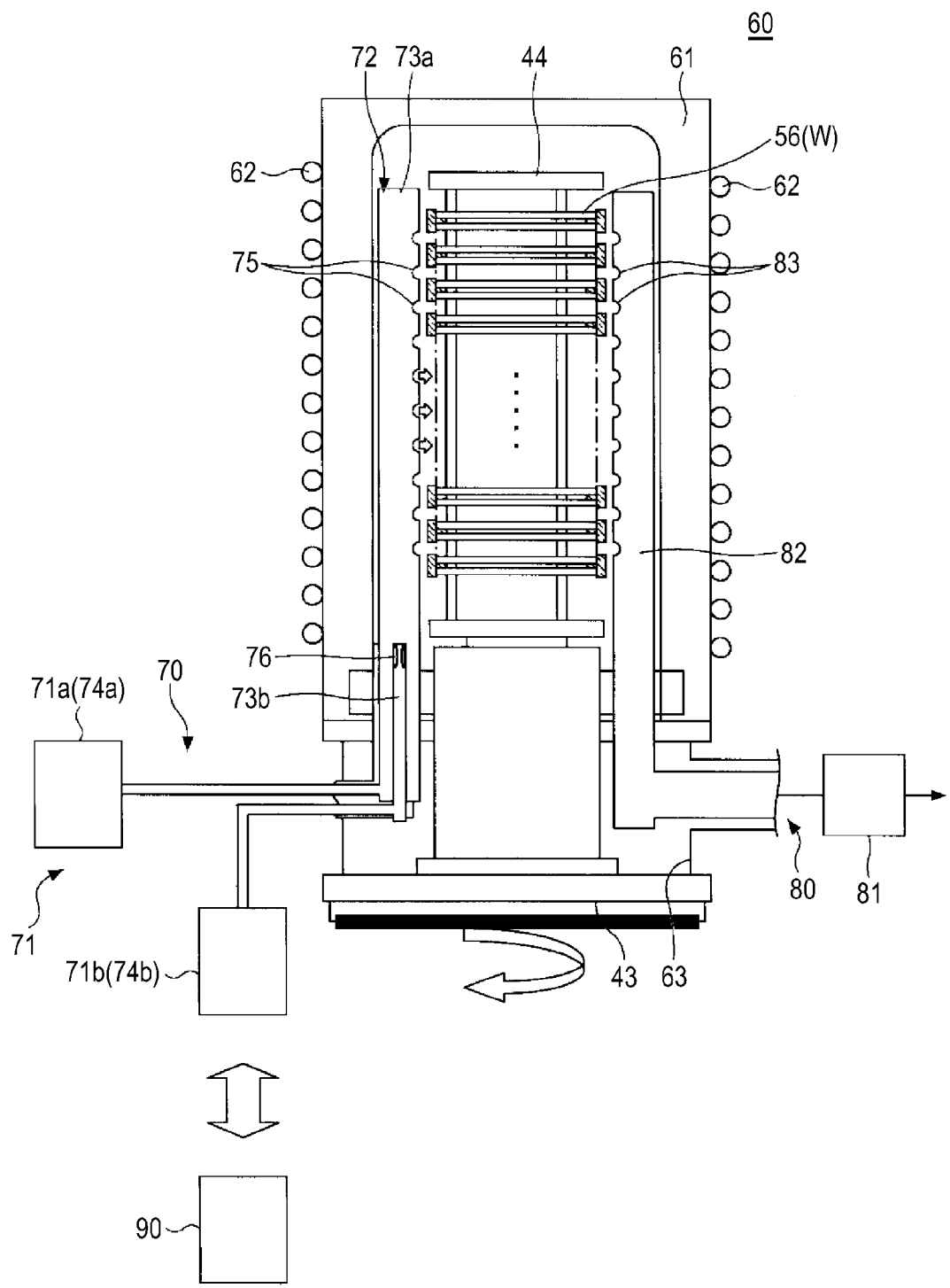
FIG. 11 is a sectional view schematically showing the configuration of the film forming container, a supply mechanism, and an exhaust mechanism.

FIG. 11 is a sectional view schematically showing the configuration of the film forming container 60, the supply mechanism 70, and an exhaust mechanism 80.

The film forming container 60 may be a vertical furnace for accommodating, for example, a plurality of target substrates, for example, the wafers W in the shape of a circular thin plate, and performing certain processing, for example, CVD, or the like. The film forming container 60 has a reaction pipe 61 and a heater (heating device) 62.

The reaction pipe 61 is made of quartz, has a vertically long shape, and has an opening 63 formed at a lower end portion thereof. The heater 62 is installed to surround of the reaction pipe 61, and heats and controls the interior of the reaction pipe 61 to have a certain temperature, for example, 300 to 1200 degrees C.

The supply mechanism 70 includes a raw material gas supply unit 71 and an injector 72 installed within the film forming container 60. The injector 72 includes a supply pipe 73a. The raw material gas supply unit 71 is connected with the supply pipe 73a of the injector 72.

In the present embodiment, the supply mechanism 70 may have a first raw material gas supply unit 71a and a second raw material gas supply unit 71b. In this case, the first raw material gas supply unit 71a and the second raw material gas supply unit 71b are connected with the injector 72 (supply pipe 73a). The first raw material gas supply unit 71a may have a first carburetor 74a for vaporizing, for example, a PMDA raw material, and supply a PMDA gas. Also, the second raw material gas supply unit 71b may have a second carburetor 74b for vaporizing, for example, an ODA raw material, and supply an ODA gas.

Figure 12:
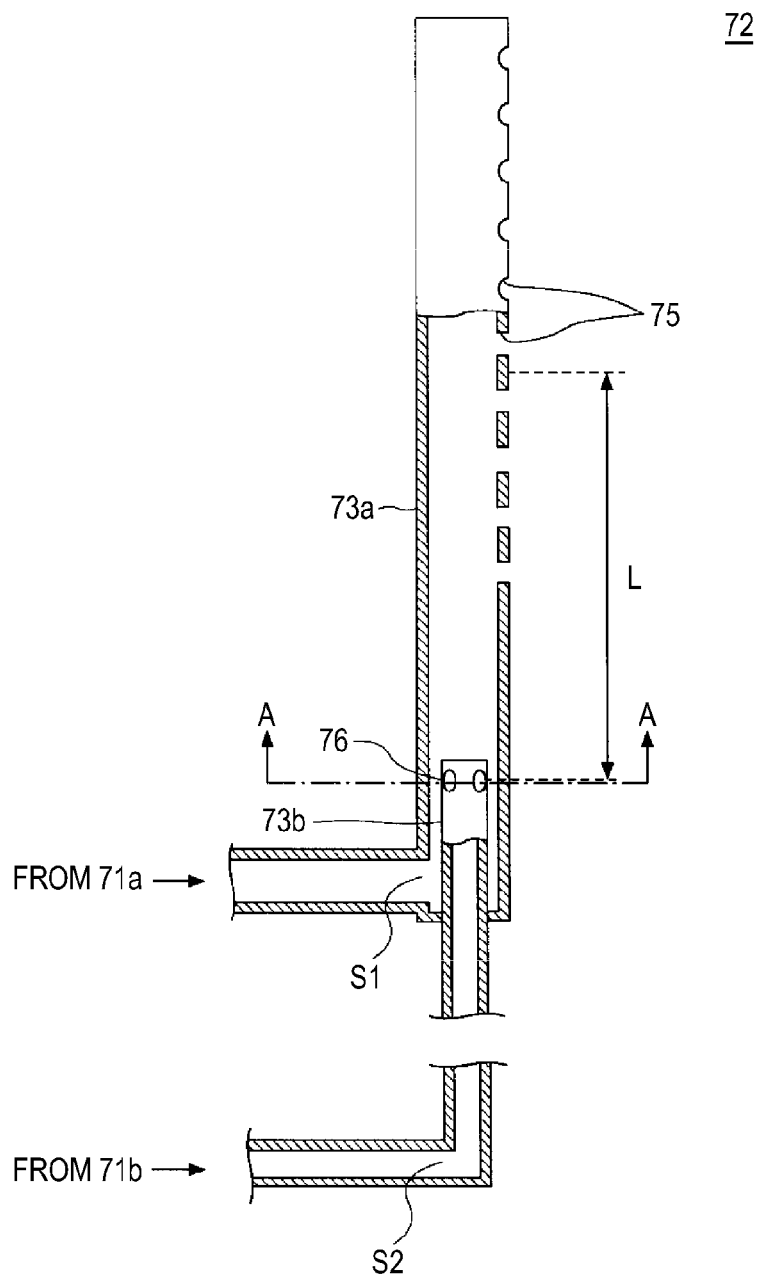
FIG. 12 is a side view illustrating an example of an injector.
Figure 13:
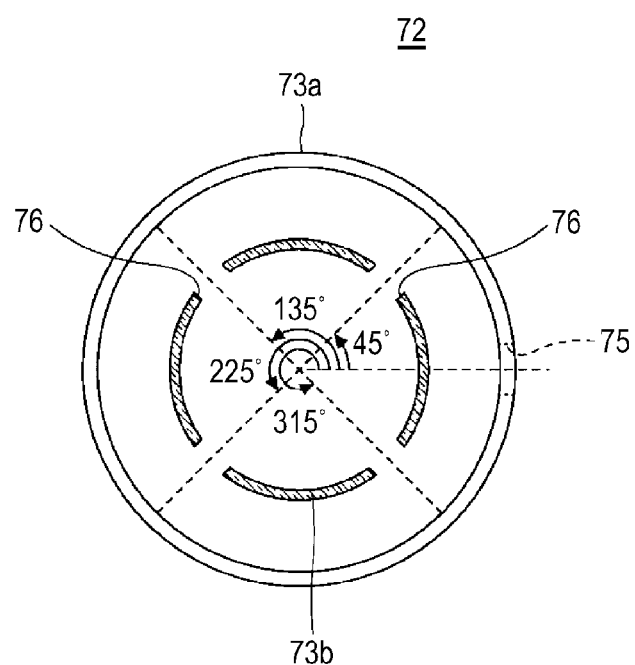
FIG. 13 is a sectional view taken along line A-A in FIG. 12.

FIG. 12 is a side view illustrating an example of the injector 72. And, FIG. 13 is a sectional view taken along line A-A in FIG. 12.

Supply holes 75 are formed on the supply pipe 73a so as to be open to the interior of the film forming container 60. The injector 72 supplies first and second raw material gases flowing in the supply pipe 73a to the film forming container 60 through the supply holes 75 from the raw material gas supply unit 71. The supply holes 75 and exhaust holes 83 (to be described later) are formed to face each other with wafers W maintained in the boat 44 interposed therebetween.

Also, in the present embodiment, an example in which the boat 44 maintains the plurality of wafers W at certain intervals in the vertical direction is described. Here, the supply pipe 73a may be installed to extend in the vertical direction. In addition, a plurality of supply holes 75 may be formed on the supply pipe 73a. Also, as will be described later, a plurality of exhaust holes 83 may be formed on the exhaust pipe 82. In this case, the plurality of supply holes 75 and the plurality of exhaust holes 83 may be formed to be spaced apart to face each other with the respective wafers W maintained in the boat 44 therebetween, respectively.

Further, the supply holes 75 may have various shapes such as a circular shape, an oval shape, a rectangular shape, and the like.

The injector 72 preferably includes an inner supply pipe. The inner supply pipe 73b may be accommodated in the vicinity of an upstream side of the supply pipe 73a, rather than at a portion where the supply holes 75 of the supply pipe 73 are formed. Also, an opening 76 may be formed in the vicinity of the end portion of the downstream side of the inner supply pipe 73b in order to supply any one of the first and second raw material gases to the inner space of the supply pipe 73a. By including the inner supply pipe 73b having such a structure, the first and second raw material gases can be sufficiently mixed in the inner space of the supply pipe 73a in advance before they are supplied to the interior of the film forming container 60 from the supply holes 75.

Also, hereinafter, the case in which the first raw material gas is supplied to the supply pipe 73a and the second raw material gas is supplied to the inner supply pipe 73b will be described as an example. However, the first raw material gas may be supplied to the inner supply pipe 73b and the second raw material gas may be supplied to the supply pipe 73a.

Further, the opening 76 may have various shapes such as a circular shape, an oval shape, a rectangular shape, and the like.

In the present embodiment, an example in which the plurality of wafers W are maintained at certain intervals in the vertical direction in the boat 44 is described. Here, the inner supply pipe 73b, along with the supply pipe 73a, may also be installed to extend in the vertical direction. Also, when the lower side is determined to be an upstream side and the upper side is determined to be a downstream side, the inner supply pipe 73b may be installed to be accommodated within the supply pipe 73a at a portion of the lower side, rather than the portion where the supply holes 75 of the supply pipe 73a are formed. In addition, the opening 76 may be formed to communicate with the inner space of the supply pipe 73a in the vicinity of the upper end portion of the inner supply pipe 73b.

The supply mechanism 70 makes, for example, the first raw material gas flow to the supply pipe 73a and, at the same time, makes the second raw material gas flow to the inner supply pipe 73b. Also, the supply mechanism 70 makes the second raw material gas flowing in the inner supply pipe 73b join with the supply pipe 73a through the opening 76, and supplies the first and second raw material gases in a mixed state into the film forming container 60 through the supply holes 75.

In the example illustrated in FIG. 12, a position S1 at which the first raw material gas is introduced to the supply pipe 73a in a direction perpendicular to the direction in which the supply pipe 73a extends is closer to the opening 76 than a position S2 at which the second raw material gas is introduced to the inner supply pipe 73b in the direction perpendicular to the direction in which the supply pipe 73a extends.

As shown in FIG. 12, the opening 76 may be formed at a lateral circumferential face in the vicinity of the upper end portion of the inner supply pipe 73b. The opening 76 is formed at the lateral circumferential face in the vicinity of the upper end portion of the inner supply pipe 73b, thereby allowing the first and second raw material gases to be more easily mixed. Assuming that the opening 76 is formed at an end portion face of the upper end portion of the inner supply pipe 73b, the direction in which the second raw material gas is supplied from the opening 76 becomes parallel to the direction in which the first raw material gas flows in the supply pipe 73a. Further, in this arrangement, if a supply amount of the first raw material gas and that of the second raw material gas are large, the first and second raw material gases cannot be easily mixed.

As shown in FIG. 13, a plurality of openings 76 may be formed in a circumferential direction of the inner supply pipe 73b in the section (horizontal section) perpendicular to the direction (vertical direction) in which the inner supply pipe 73b extends. Preferably, the openings 76 are formed in a different direction from the direction in which the supply holes 75 are formed on the supply pipe 73a when viewed from the section (when viewed from the plane) perpendicular to the direction in which the supply pipe 73a extends. Namely, preferably, all openings 76 are formed to face in a different direction from the direction toward the wafers W and the exhaust pipe 82. Also, four openings 76 are formed by equal interval in the circumferential direction of the inner supply pipe 73b, and the direction in which the respective openings 76 are formed may be at angles of 45°, 135°, 225°, 315°, respectively, with respect to the direction in which the supply holes 75 are formed. Thus, since the openings 76 are disposed in this manner, the concentration of the supplied raw material gasses can be uniform in the entirety of the supply holes 75 as described later with reference to FIGS. 14 to 17.

It is assumed that an outer diameter of the supply pipe 73a is, for example, 33 m, an inner diameter thereof is, for example, 29 mm, a hole diameter of the supply hole 75 is, for example, 2 mm, and the number of the formed supply holes 75 is, for example, 10. Also, it may be assumed that an outer diameter of the inner supply pipe 73b is, for example, 22 mm, an inner diameter thereof is, for example, 18 mm, and the hole diameter of the opening 76 formed at the angle of 45° may be, for example, 10 mm.

Here, it will be described with reference to two examples that the opening 76 is preferably formed toward a different direction from the direction in which the supply holes 75 are formed in order to allow the concentration of the raw material gases supplied from the supply holes 75 to be uniform. Hereinafter, the case in which the first raw material gas is supplied from the supply pipe 73a and the second raw material gas is supplied from the inner supply pipe 73b will be described.

Figure 14:
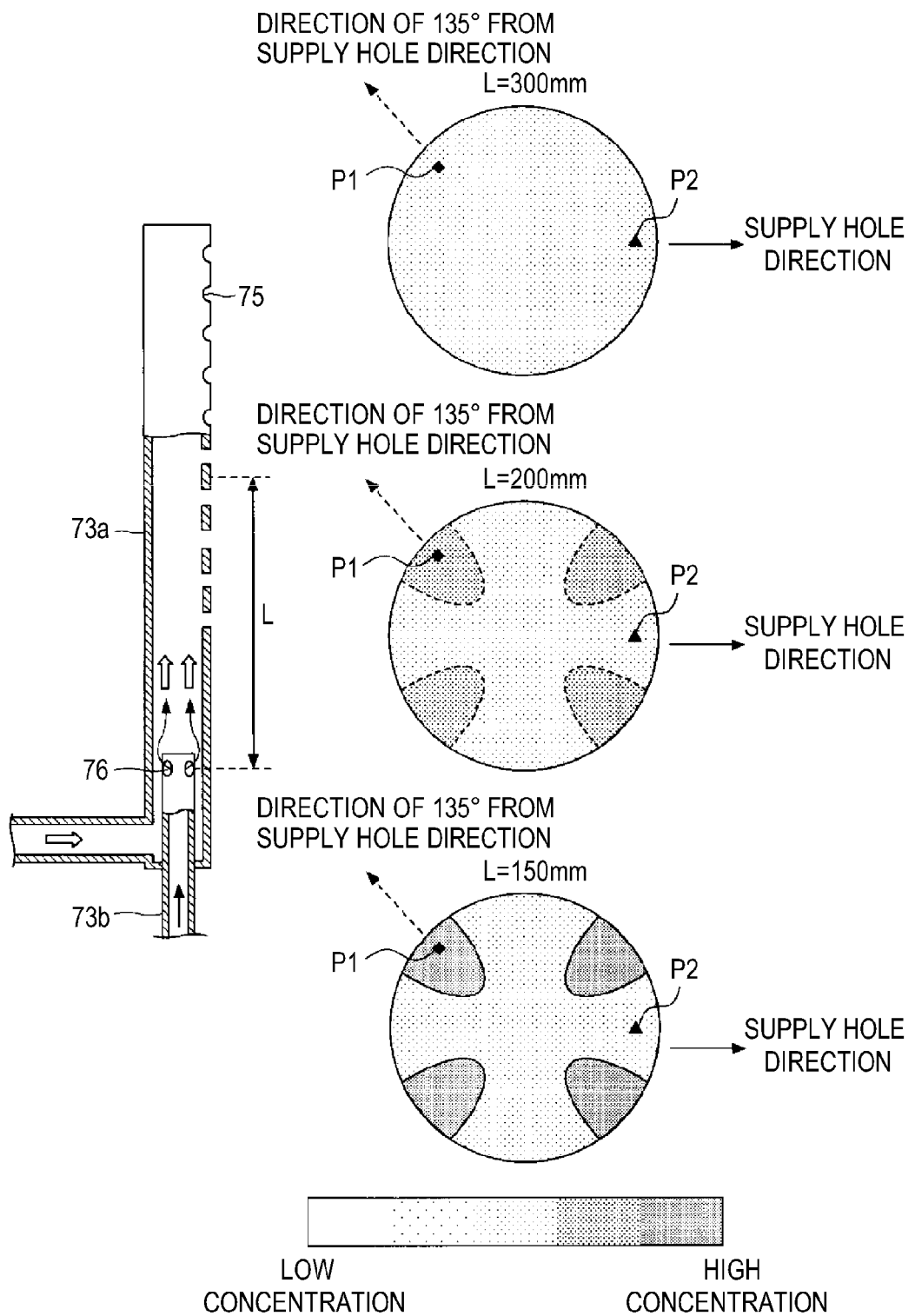
FIG. 14 is a view schematically showing a concentration distribution of a raw material gas at a position of a distance L from an opening.
Figure 15:
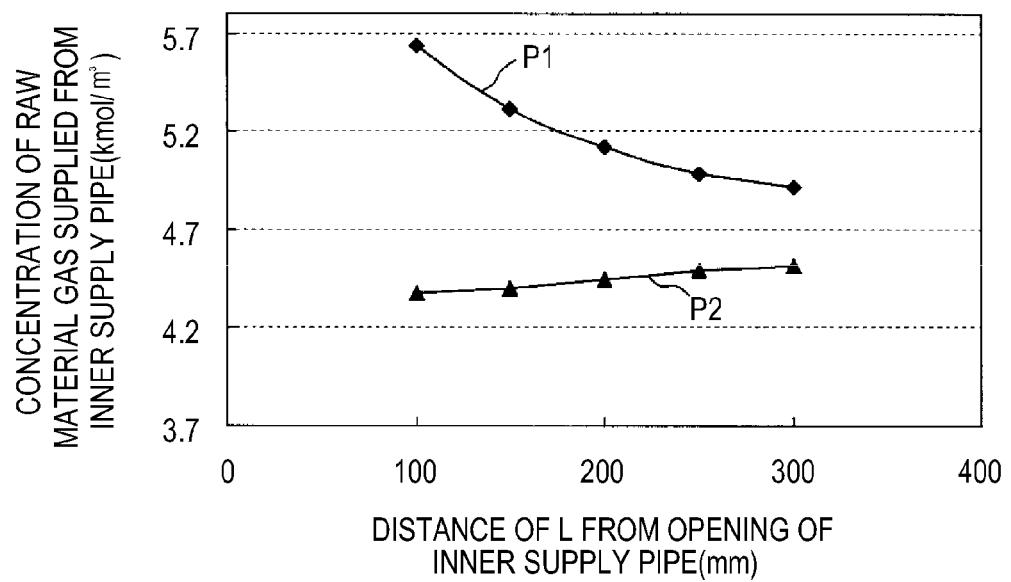
FIG. 15 is a graph showing an example of distance dependency of a concentration distribution of a second raw material gas at points P1 and P2 in FIG. 14.

As a first example, a case in which the ratio between a supply amount of the first raw material gas supplied from the supply pipe 73a and a supply amount of the second raw material gas supplied from the inner supply pipe 73b is 1:2 will be described with reference to FIGS. 14 and 15. FIG. 14 is a view schematically showing a concentration distribution of the second raw material gas at a position of a distance of L from the opening 76. FIG. 14 illustrates a concentration distribution of the second raw material gas at each position of L=150 mm, 200 mm, and 300 mm. FIG. 15 is a graph showing an example of distance dependency of a concentration distribution of the second raw material gas (raw material gas supplied from the inner supply pipe) at points P1 and P2 in FIG. 14.

It is assumed that a point at a different direction from the direction of the supply holes 75 is point P1 and a point in the same direction as that of the supply holes 75 is point P2. In FIG. 14, for example, it is assumed that a point in the direction at 135° with the direction of the supply hole 75 is point P1.

Since the opening 76 is disposed as shown in FIG. 13, the concentration distribution of the second raw material gas supplied from the opening 76 is increased in the direction in which the opening 76 is formed, namely, in the direction making angles of 45°, 135°, 225°, and 315° with the direction in which the supply holes 75 are formed. Also, for example, the concentration of the second raw material gas at the point P1 decreases as L is increased and the concentration distribution is averaged as shown in FIGS. 14 and 15.

Further, the concentration distribution of the second raw material gas is relatively averaged, rather than being high, in a direction different from the direction in which the opening 76 is formed, namely, in the direction making angles of 0°, 90°, 180°, and 270° with the direction in which the supply holes 75 are formed. Also, for example, the concentration of the second raw material gas at point P2 changes little and is uniform although L is increased as shown in FIGS. 14 and 15.

Figure 16:
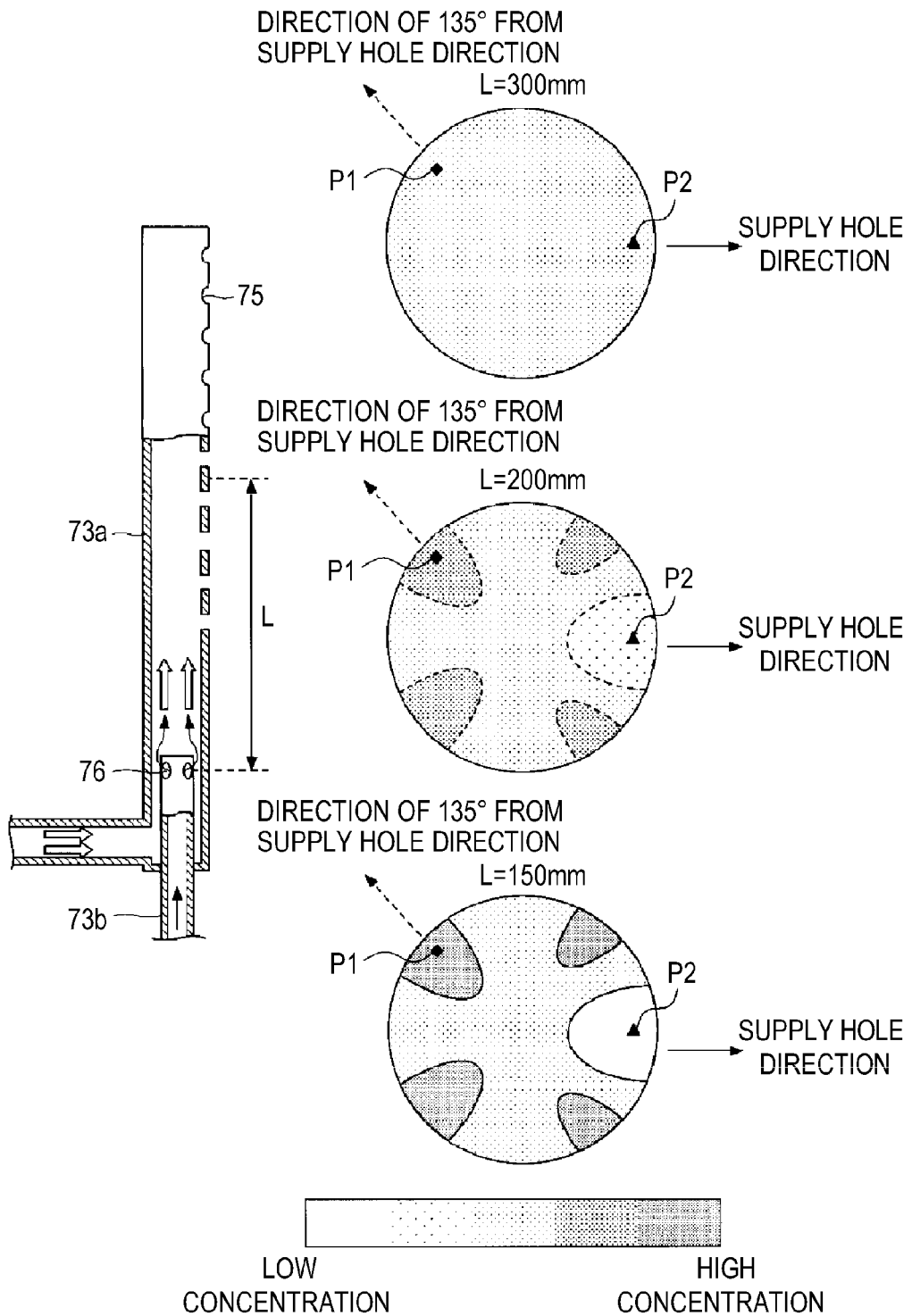
FIG. 16 is a view schematically showing a concentration distribution of a raw material gas at a position of a distance L from an opening.
Figure 17:
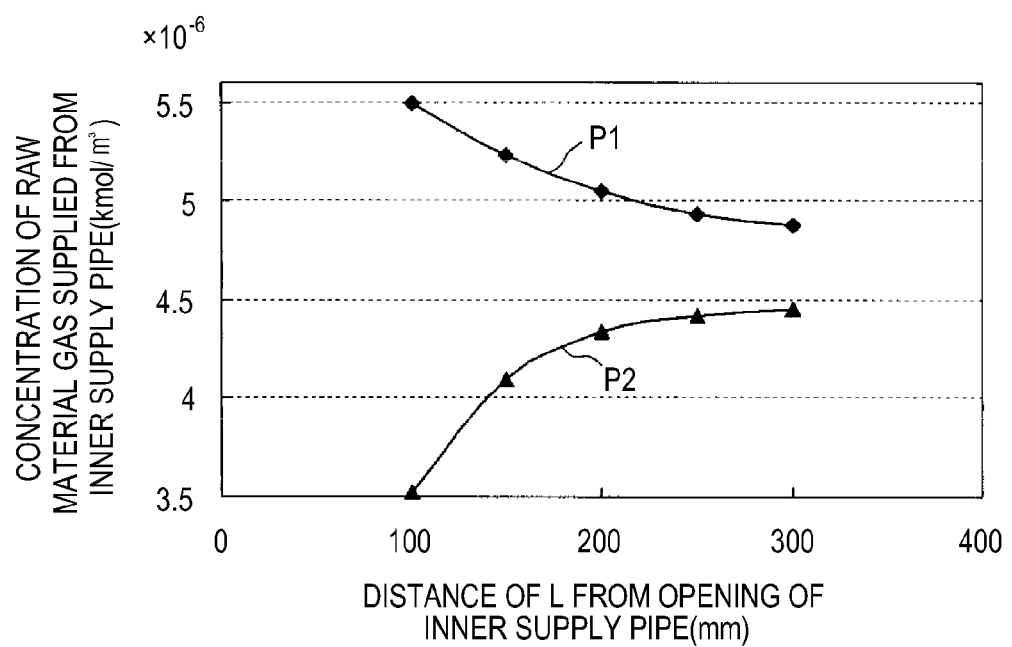
FIG. 17 is a graph showing an example of distance dependency of a concentration distribution of a second raw material gas at points P1 and P2 in FIG. 16.

Next, as a second example, a case in which the ratio between a supply amount of the first raw material gas supplied from the supply pipe 73a and a supply amount of the second raw material gas supplied from the inner supply pipe 73*b* is 2:1 will be described with reference to FIGS. 16 and 17. FIG. 16 is a view schematically showing a concentration distribution of the second raw material at a position of a distance L from the opening 76. FIG. 16 illustrates a concentration distribution of the second raw material gas at each position of L=150 mm, 200 mm, and 300 mm. FIG. 17 is a graph showing an example of distance dependency of a concentration distribution of a second raw material gas (a raw material gas supplied from the inner supply pipe) at points P1 and P2 in FIG. 16.

It is assumed that a point at a different direction from the direction of the supply holes 75 is point P1 and a point in the same direction as that of the supply holes 75 is point P2. Also, in FIG. 16, for example, it is assumed that a point in the direction at 135° with the direction of the supply hole 75 is point P1.

Since the opening 76 is disposed as shown in FIG. 13, the concentration distribution of the second raw material gas supplied from the opening 76 is increased in the direction in which the opening 76 is formed, namely, in the direction making angles of 45°, 135°, 225°, and 315° with the direction in which the supply holes 75 are formed. Also, for example, the concentration of the second raw material gas at the point P1 decreases as L is increased and the concentration distribution is averaged as shown in FIGS. 16 and 17.

Further, the concentration distribution of the second raw material gas is lower in the direction in which the supply holes 75 are formed than in other directions. It is considered that this is because the position at which the first raw material gas is introduced in the horizontal direction to the supply pipe 73*a* is closer to the opening 76 than the position at which the second raw material gas is introduced in the horizontal direction to the inner supply pipe 73*b*. Namely, it is considered that since the horizontal force of inertia remains high in the first raw material gas flowing in the supply pipe 73*a* and the concentration of the first raw material gas is increased at the side of the supply hole 75, the concentration of the second raw material gas is reduced. For example, the concentration of the second raw material gas at the point P2 increases as L is increased and the concentration distribution is averaged as shown in FIGS. 16 and 17.

Also, when the ratio between the supply amount of the first raw material gas supplied from the supply pipe 73*a* and the supply amount of the second raw material gas supplied from the inner supply pipe 73*b* is 1:1, the results fall between the two examples.

Further, in the case in which the second raw material gas is supplied from the supply pipe 73*a* and the first raw material gas is supplied from the inner supply pipe 73*b*, the completely same effect can be obtained by simply altering the second raw material gas and the first raw material gas.

Thus, when the position at which the raw material gas is introduced in the horizontal direction to the supply pipe 73*a* is closer to the opening 76 than the position at which the raw material gas is introduced in the horizontal direction to the inner supply pipe 73*b*, the direction of the opening 76 may be adjusted to be inconsistent with respect to the direction of the supply holes 75 and the supply amount of the raw material gas introduced into the supply pipe 73*a* may be adjusted to be substantially equal to or smaller than the supply amount of the raw material gas introduced into the inner supply pipe 73*b*, thus making the concentration of the supplied raw material gas uniform in the entirety of the supply holes 75.

As shown in FIG. 11, the exhaust mechanism 80 includes an exhaust device 81 and an exhaust pipe 82 installed within the film forming container 60. The exhaust mechanism 80 serves to exhaust gas from the interior of the film forming container 60.

The exhaust device 81 is connected to the exhaust pipe 82. The exhaust pipe 82 has exhaust holes 83 formed thereon. As described above, the supply holes 75 and the exhaust holes 83 are formed to face each other with the wafers W maintained in the boat 44 interposed therebetween.

In the present embodiment, an example in which the boat 44 maintains the plurality of wafers W at certain intervals in the vertical direction is described. Here, the exhaust pipe 82 may be installed to extend in the vertical direction. Also, a plurality of exhaust holes 83 may be formed on the exhaust pipe 82. Further, as described above, the plurality of supply holes 75 may be formed on the supply pipe 73*a*. In addition, the plurality of supply holes 75 and the plurality of exhaust holes 83 may be formed at certain intervals such that they face each other with the respective wafers W maintained in the boat 44 interposed therebetween, respectively.

Further, in the present embodiment, the plurality of exhaust holes 83 may be formed such that the hole diameter of each of the exhaust holes 83 is reduced toward a downstream side of the exhaust pipe 82 from an upstream side. An example of such an exhaust pipe 82 is illustrated in the side view of FIG. 18.

Figure 18:
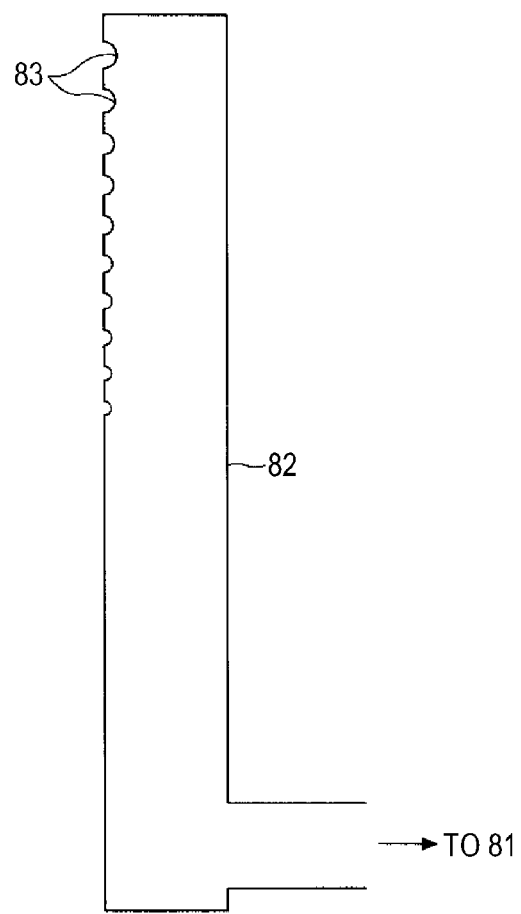
FIG. 18 is a side view showing an example of an exhaust pipe.

As shown in FIG. 11, by connecting the exhaust device 81 to a lower portion of the exhaust pipe 82, the upper side may be assumed to be an upstream side and a lower side may be assumed to be a downstream side. In this case, as shown in FIG. 18, the hole diameter of the exhaust hole 83 may be formed to be reduced toward the lower side from the upper side.

When the exhaust holes 83 are formed to have an equal hole diameter at certain intervals from the upstream side of the exhaust pipe 82 to the downstream side thereof, conductance of each portion of the exhaust pipe 82 is reduced toward the upstream side from the downstream side. Namely, there is the possibility that an exhaust volume at the upstream side (upper side) is reduced. Meanwhile, the hole diameter of the exhaust hole 83 may be formed to be reduced toward the downstream side from the upstream side to reduce the difference in conductance at each portion of the exhaust pipe 82. Thus, since the exhaust volume of the gas exhausted to the exhaust pipe 83 can become uniform in the entirety of the exhaust holes 83, the supply amount of the raw material gas within the plane of the wafer can become uniform, thus stably forming a film on the substrate.

It is assumed that an inner diameter of the exhaust pipe 82 is, for example, 336 mm, and the number of the exhaust holes 83 is, for example, 10. In this case, the hole diameter of the exhaust hole 83 at the uppermost end may be, for example, 30 mm, that of the exhaust hole 83 at the lowermost end may be, for example, 28.2 mm, and the hole diameters of the respective exhaust holes 83 may be reduced toward the lowermost end from the uppermost end.

The controller 90 includes, for example, an operation processing unit, a memory unit, and a display unit (not shown). The operation processing unit is, for example, a computer having a central processing unit (CPU). The memory unit is, for example, a computer-readable recording medium configured by a hard disk storing a program for executing various processing in the operation processing unit. The display unit is composed of, for example, a computer screen. The operation processing unit reads the program stored in the memory unit, transmits a control signal to each component constituting the boat 44 (substrate maintaining unit), the supply mechanism 70, and the exhaust mechanism 80, and executes film formation processing (to be described later), depending on the program.

Figure 19:
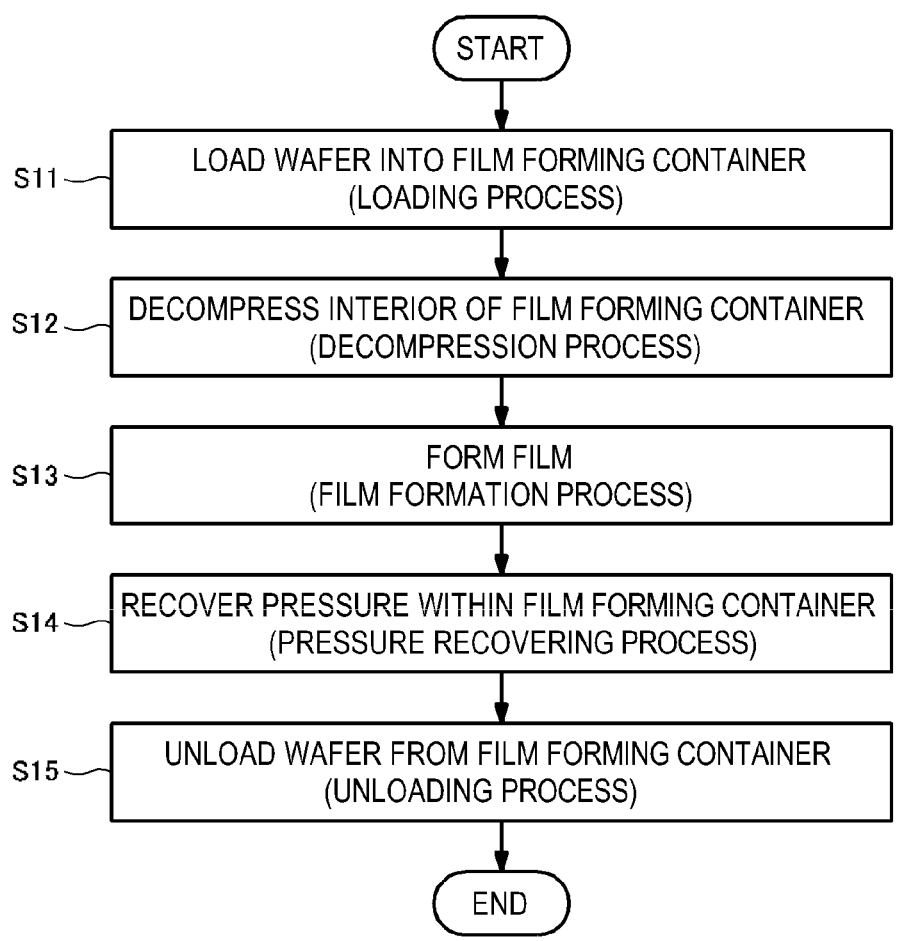
FIG. 19 is a flow chart illustrating a sequential process including film formation processing using the film forming apparatus according to the first embodiment.

Next, film formation processing using the film forming apparatus according to the present embodiment will be described. FIG. 19 is a flowchart illustrating a sequential process including film formation processing using a film forming apparatus according to the present embodiment.

When the film formation processing starts, the wafer W is loaded into the film forming container 60 in step S11 (loading process). In the example of the film forming apparatus 10 illustrated in FIGS. 1 to 4, for example, the wafer W (double-plate unit 56) is mounted in the boat 44a from the receiving container 21 by the movement mounting mechanism 47 in the loading area 40, and the boat 44a with the wafer W (double-plate unit 56) mounted therein is loaded on the cover 43 by the boat transfer mechanism 45c. Then, the cover 43 with the boat 44a loaded thereon is lifted by the lifting mechanism 46 so as to be inserted into the film forming container 60, thus loading the wafer W.

Next, in step S12, the interior of the film forming container 60 is decompressed (decompression process). An exhaust capability of the exhaust device 81 or a flow rate adjustment valve (not shown) installed between the exhaust device 81 and the exhaust pipe 82 is adjusted to increase an exhaust volume of exhausting the film forming container 60 through the exhaust pipe 82. The interior of the film forming container 60 is decompressed from a certain pressure, for example, from atmospheric pressure (760 Torr), for example, to 0.3 Torr.

Thereafter, in step S13, a polyimide film is formed (film formation process).

Prior to step S13 or in step S13, a first flow rate F1 at which the first raw material gas flows to the supply pipe 73a and a second flow rate F2 at which the second raw material gas flows to the inner supply pipe 73b are preset by the controller 90. In addition, in a state in which the wafer W is rotated by the rotary mechanism 49, the first raw material gas is introduced to the supply pipe 73a from the first raw material gas supply unit 71a at the preset first flow rate F1, and the second raw material gas is introduced to the inner supply pipe 73b from the second raw material gas supply unit 71b at the preset second flow rate F2, and the first and second raw material gases mixed in a certain mixture ratio are supplied into the film forming container 60. More specifically, for example, the first flow rate F1 may be 900 sccm, and the second flow rate F2 may be 900 sccm. Then, PMDA and ODA are polymerized on the surface of the wafer W to form a polyimide film.

The polymerization of PMDA and ODA in this case follows Chemical Formula 1 as follows:

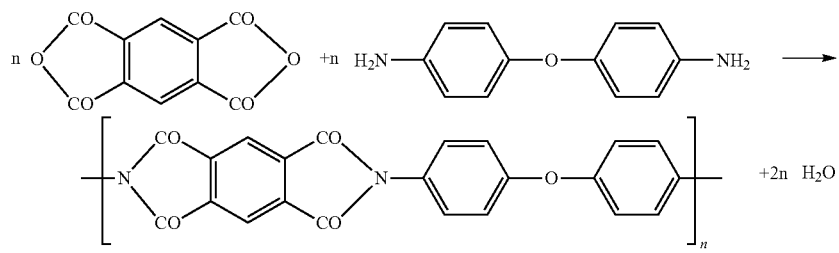

In the film formation process, since gases are supplied from one point of a lateral side of the wafer W, the raw material gases can easily reach a circumferential portion of the wafer W, but cannot easily reach a central portion of the wafer W. Thus, in order to obtain uniform film thickness within the plane of the wafer W by making the film forming rate at the central portion and that at the circumferential portion equal, it is important to control the flow rate of the raw material gases, the pressure within the film forming container, and the interval between wafers W as described below.

Figure 20:
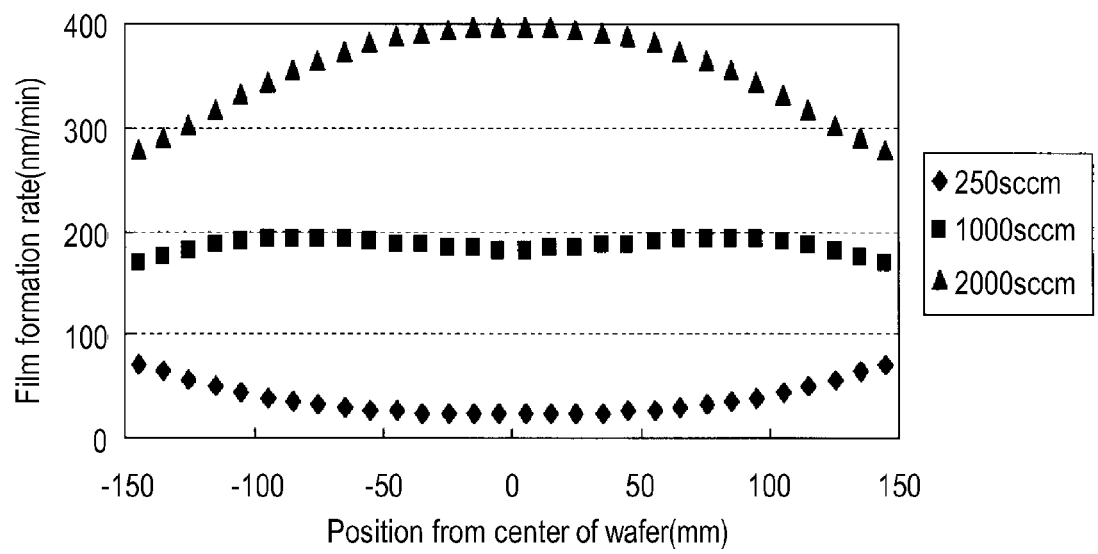
FIG. 20 is a graph showing calculation results of film formation rates at respective positions from the center of a wafer W of a polyimide film formed according to a film formation process when the flow rates of raw material gases are changed.
Figure 21:
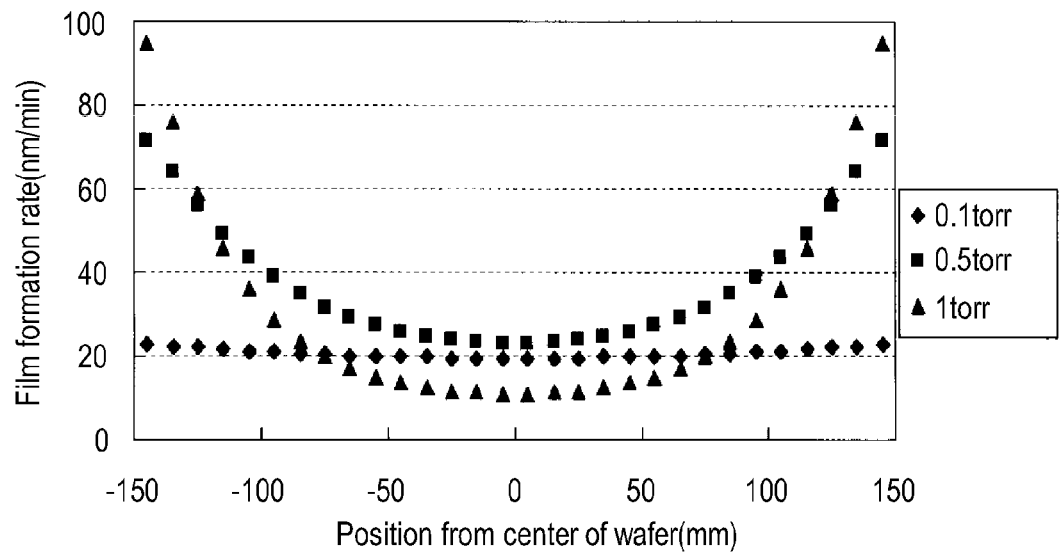
FIG. 21 is a graph showing calculation results of film formation rates at respective positions from the center of a wafer W of a polyimide film formed according to the film formation process when the pressure within the film forming container is changed.
Figure 22:
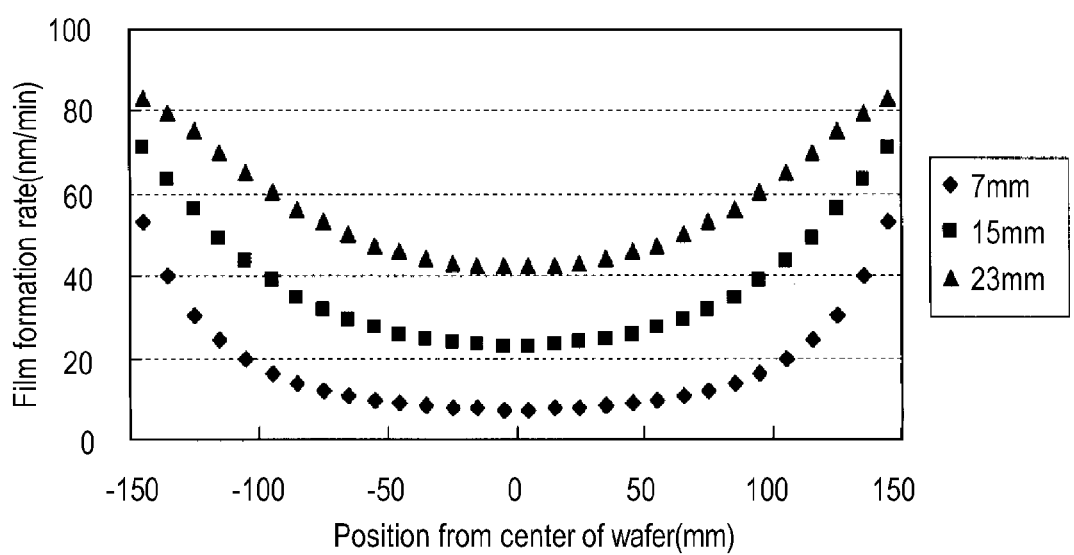
FIG. 22 is a graph showing calculation results of film formation rates at respective positions from the center of a wafer W of a polyimide film formed according to the film formation process when the interval of wafers W is changed.

FIGS. 20 to 22 are graphs showing calculation results of film formation rates at each position from the center of the wafer W of the polyimide film formed according to the film formation process when flow rates of the raw material gases, the pressure within the film forming container, and the interval between the wafers W are changed. In FIGS. 20 to 22, the vertical axis denotes the film formation rate of the polyimide film formed when the film formation process is performed during an equal film formation period of time in the event that the flow rates of the raw material gases, the pressure within the film forming container, and the interval between the wafers W are changed. Further, in FIGS. 20 to 22, for example, the diameter of the wafer W is 300 mm.

FIG. 20 shows film formation rates when a flow rate of raw material gases in total is changed to 250 sccm, 1000 sccm, and 2000 sccm in a state in which the ratio of the flow rates of the first and second raw material gases is 1:1. When the flow rate of the raw material gases is increased from 250 sccm to 2000 sccm, the film formation rate in the circumferential portion and the central portion of the wafer W is increased. However, the distribution of the film formation rates at each position of the wafer W is not uniform. The ratio of the film formation rate at the central portion to the film formation rate at the circumferential portion considerably increases as the flow rate is increased from 250 sccm to 2000 sccm. The ratio of the film formation rate at the central portion to the film formation rate at the circumferential portion is smaller than 1 when the flow rate is 250 sccm, but greater than 1 when the flow rate is 2000 sccm. It is believed that when the flow rate is small, the raw material gases cannot be easily introduced between the stacked wafers W, but when the flow rate is increased, the raw material gases can be easily introduced between the stacked wafers W and thus can easily reach the central portion. Thus, in order to make the film thickness of the polyimide film formed on each wafer W uniform within the plane, it is important to control the flow rates of the raw material gases supplied to each wafer W such that they are within an appropriate flow rate range.

FIG. 21 shows film formation rates when the pressure within the film forming container is changed to 0.1 Torr, 0.5 Torr, and 1 Torr. As the pressure within the film forming container is increased from 0.1 Torr to 1 Torr, the film formation rate at the circumferential portion of the wafer W is increased. However, the distribution of the film formation rates at each position of the wafer W is not uniform. The ratio of the film formation rate at the central portion to the film formation rate at the circumferential portion considerably decreases as the pressure within the film forming container is increased from 0.1 Torr to 1 Torr. It is believed that when the pressure is low, the raw material gases can easily spread between the stacked wafers W, but when the pressure is increased, the raw material gases cannot be easily introduced between the stacked wafers W and thus cannot easily reach the central portion. Thus, in order to make the film thickness of the polyimide film formed on each wafer W uniform within the plane, it is important to control the pressure within the film forming container such that it is relatively small.

FIG. 22 shows film formation rates when the interval of wafers W is changed to 7 mm, 15 mm, and 23 mm. As the interval between the wafers W is increased from 7 mm to 23 mm, the film formation rate at the circumferential portion of the wafer W is increased. However, the distribution of the film formation rates at each position of the wafer W is not uniform. The ratio of the film formation rate at the central portion to the film formation rate at the circumferential portion gradually increases as the interval between the wafers W is increased from 7 mm to 23 mm. It is believed that when the interval between the wafers W is increased, the raw material gases can be easily introduced between the wafers W stacked at certain intervals and thus can easily reach the central portion. Thus, in order to make the film thickness of the polyimide film formed on each wafer W uniform within the plane, it is important to control the interval between the wafers W such that it is relatively large.

Meanwhile, in the present embodiment, the plurality of supply holes 75 and the plurality of exhaust holes 83 are formed at certain intervals such that they face each other with the respective wafers W maintained in the boat 44 interposed therebetween, respectively. Also, the controller 90 controls the supply mechanism 70 and the exhaust mechanism 80 to supply the raw material gases by the supply mechanism 70 and, at the same time, exhaust the gases by the exhaust mechanism 80. Further, the controller 90 provides control to flow the first raw material gas formed as, for example, a PMDA gas, at the preset first flow rate F1, and flow the second raw material gas formed as, for example, an ODA gas, at the preset second flow rate F2, while adjusting the concentration of the raw material gases supplied to the entirety of the supply holes 75 to be uniform. Also, the controller 90 may control the exhaust volume of the gases exhausted to the exhaust pipe 82 in the entirety of the exhaust holes 83 such that they are equal. Accordingly, in a state in which the first and second raw material gases are mixed in a certain mixture ratio, the controller 90 can supply the first and second raw material gases as a laminar flow to the surface of the wafer W while controlling the supply amount such that it is constant. Accordingly, the film formation rate within the plane of the wafer W can become uniform, and thus, the film thickness and film quality within the plane of the wafer W can become uniform.

Further, in the present embodiment, the plurality of wafers W can be maintained in the vertical direction such that an interval between two sheets of wafers W that vertically neighbor with rear surfaces Wb thereof facing each other is narrower than the interval between two sheets of wafers W that vertically neighbor with surfaces Wa thereof facing each other. Accordingly, in a state in which the number of wafers W mounted in the boat 44 is fixed, the interval of two sheets of wafers W that vertically neighbor with surfaces Wa thereof facing each other can be increased. As a result, the gap between the surface Wa of one wafer W and the surface Wa of the other wafer W can be increased, thus allowing the supply of a sufficient amount of raw material gases to the surface of the wafers W.

Also, in the present embodiment, the support ring 55 may have a spacer unit 55b installed to block the gap between two sheets of wafers W that vertically neighbor with rear surfaces Wb thereof facing each other. Accordingly, when a film is formed within the film forming container 60, raw material gases can be prevented from being introduced between two sheets of wafers W with the rear surfaces Wb thereof facing each other to form a film on the rear surfaces Wb of the wafers W.

Thereafter, in step S14, a supply of the PMDA gas from the first raw material gas supply unit 71a and a supply of the ODA gas from the second raw material gas supply unit 71b are stopped and the interior of the film forming container 60 is recovered to the atmospheric pressure (pressure recovering process). The exhaust capability of the exhaust device 81 or a flow rate adjustment valve (not shown) installed between the exhaust device 81 and the exhaust pipe 82 is adjusted to reduce the exhaust volume of exhausting the film forming container 60, thus recovering the interior of the film forming container 60 into, for example, the atmospheric pressure (760 Torr) from, for example, 0.3 Torr.

Next, in step S15, the wafers W are unloaded from the film forming container 60 (unloading process). In the example of the film forming apparatus 10 illustrated in FIGS. 1 to 4, for example, the cover 43 with the boat 44a loaded thereon is lowered by the lifting mechanism 46 so as to be unloaded to the loading area 40 from the interior of the film forming container 60. Then, the wafers W are moved to be mounted in the receiving container 21 from the boat 44a loaded on the cover 43, unloaded by the movement mounting mechanism 47, thereby unloading the wafers W from the film forming container 60. Thereafter, the film formation processing is terminated.

Further, when film formation processing is continuously performed on a plurality of batches, in the loading area 40, the wafers W are moved to be mounted on the boat 44 from the receiving container 21 by the movement mounting mechanism 47, and the process again returns to step S11 in which film formation processing is performed on a next batch.

As described above, in the present embodiment, the film forming apparatus 10 can have two boats. Thus, step S11 of the rear batch can be performed immediately after step S15 of the front batch. Namely, before step S15 of the front batch, the wafers W of the rear batch can be moved from the receiving container 21 and mounted on the boat 44b so as to be ready. Further, in step S15 of the front batch, immediately after the boat 44a is unloaded from the film forming container 60, the boat 44b with the wafers W of the rear batch mounted thereon can be loaded into the film forming container 60. Accordingly, a time (tact time) required for film formation processing can be shortened, thus reducing fabrication cost.

Second Embodiment

A film forming apparatus according to a second embodiment of the present disclosure will now be described with reference to FIGS. 23 and 24.

A film forming apparatus 10a according to the present embodiment is different from the film forming apparatus according to the first embodiment, in that the film forming apparatus 10a includes only one boat. In addition, the film forming apparatus 10a according to the present embodiment is different from the film forming apparatus 10 according to the first embodiment, in that the boat 44 maintains a plurality of wafers W in the vertical direction such that rear surfaces Wb of vertically neighboring wafers W do not face each other and surfaces Wa of vertically neighboring wafers W do not face each other. Also, the film forming apparatus 10a according to the present embodiment is different from the film forming apparatus 10 according to the first embodiment, in that only the first raw material gas is supplied. Other portions of the film forming apparatus 10a according to the present embodiment are the same as those of the film forming apparatus 10 according to the first embodiment, and therefore, descriptions thereof will be omitted.

Figure 23:
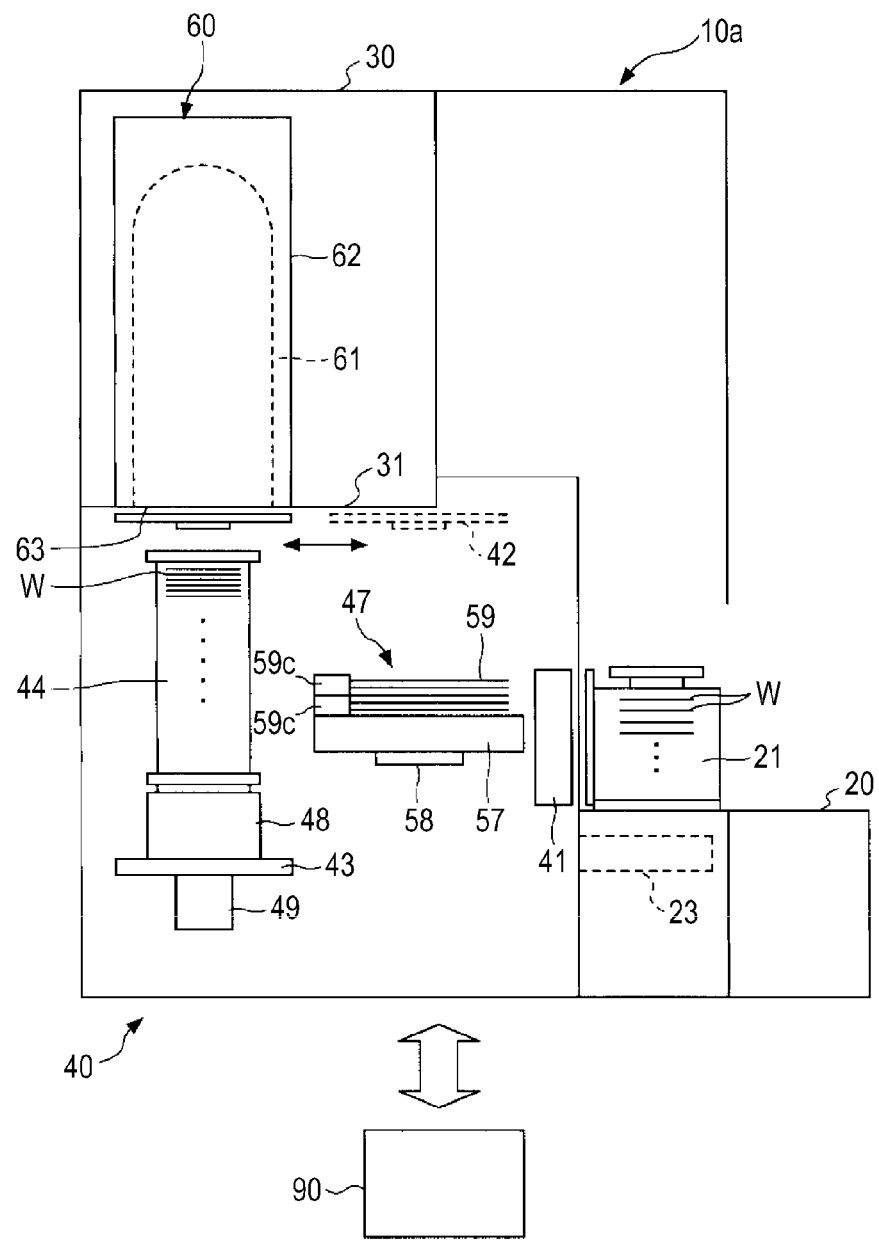
FIG. 23 is a vertical sectional view schematically showing a film forming apparatus according to a second embodiment.

FIG. 23 is a vertical sectional view schematically showing a film forming apparatus 10a according to the present embodiment.

The film forming apparatus 10a includes a loading table (load port) 20, a housing 30, and a controller 90. Also, the housing 30 has a loading area (operation area) 40, and a film forming container 60. The positional relationships among the loading table 20, the housing 30, the loading area 40, and the film forming container 60 are the same as those of the film forming apparatus 10 according to the first embodiment.

The loading table (load port) 20 may be the same as the loading table (load port) 20 of the film forming apparatus 10 according to the first embodiment, except that a receiving container for receiving a support ring is not loaded thereon.

A door mechanism 41, a shutter mechanism 42, a cover 43, a boat 44, a lifting mechanism 46, and a movement mounting mechanism 47 are installed in the loading area (operation area) 40. Other portions than the cover 43, the boat 44, and the movement mounting mechanism 47 may be the same as those of the film forming apparatus 10 according to the first embodiment.

As for the cover 43 and the boat 44, they are different from the loading table 20 of the film forming apparatus 10 according to the first embodiment in that only a single boat 44 is provided and the boat 44 is constantly loaded on the cover 43. That is, the bases 45a and 45b and the boat transfer mechanism 45c, which are installed in the film forming apparatus 10 according to the first embodiment, may not be installed.

The boat 44 may be the same as the boat 44 illustrated in FIG. 4, and a plurality of pillars, for example, three pillars 52, are interposed between the ceiling plate 50 and the bottom plate 51. The hook portion 53 for maintaining the wafers W is installed on the pillars 52. In this case, in the present embodiment, among the plurality of wafers W, any wafer W is mounted in a state in which its surface Wa is used as a lower surface, or in a state in which its surface Wa is used as an upper surface. Thus, the present embodiment is different from the first embodiment, and the same number of hook portions 53 as that of the sheets of the mounted wafers W are installed. Therefore, in order to mount the same number of sheets of wafers W as that of the first embodiment, hook portions 53 which are double the number of hook portions 53 in the first embodiment are installed in the boat 44 at half intervals of the intervals of the hook portions 53 in the first embodiment.

The movement mounting mechanism 47 includes a base 57, a lifting arm 58, and a plurality of forks (movement mounting plates) 59. In the present embodiment, a vertically reversible upper fork may not be provided, and the plurality of forks 59 may be installed to be only horizontally movable by the moving body 59c.

Figure 24:
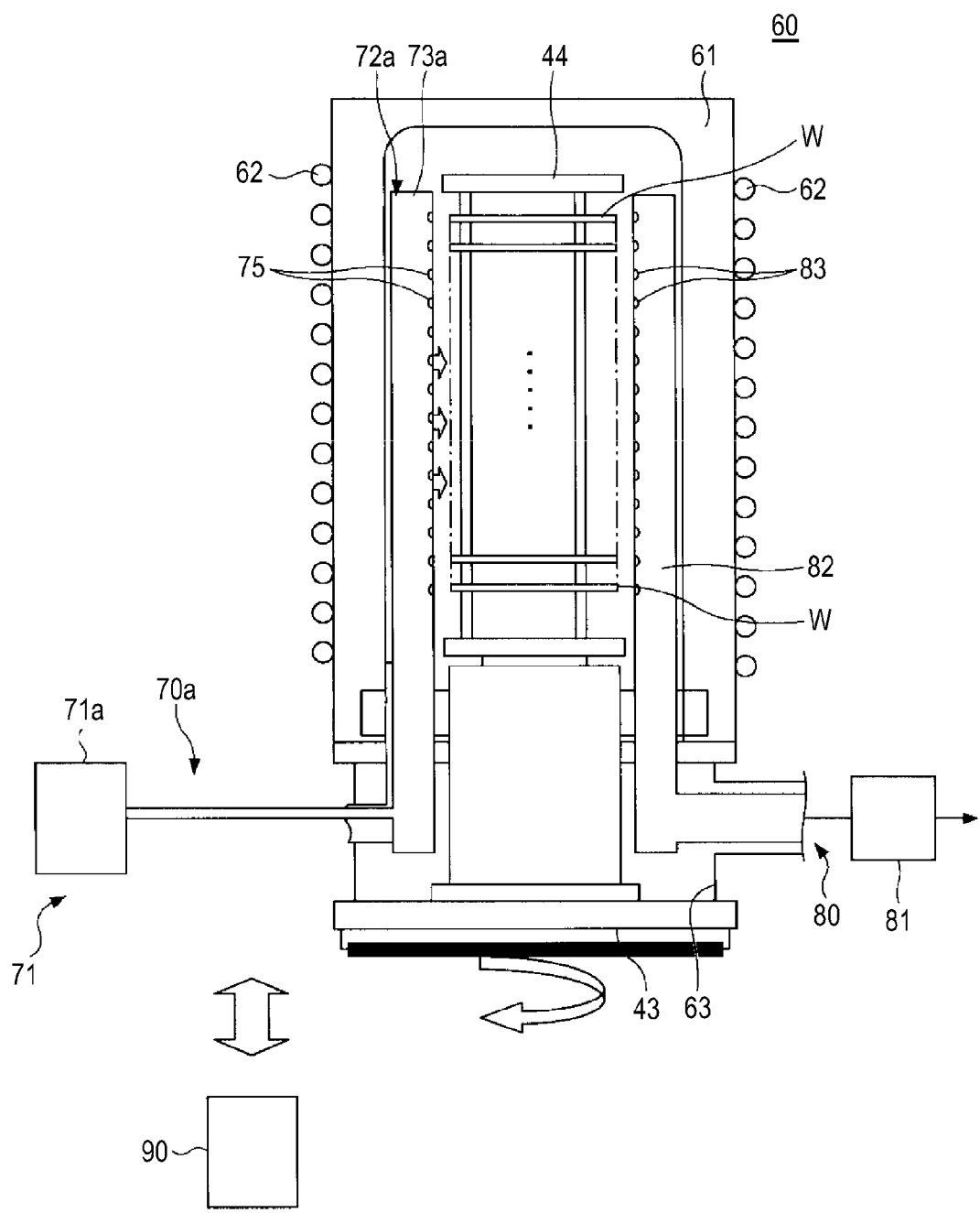
FIG. 24 is a sectional view schematically showing the configuration of a film forming container, a supply mechanism, and an exhaust mechanism of the film forming apparatus illustrated in FIG. 23.

FIG. 24 is a sectional view schematically showing a configuration of the film forming container 60, a supply mechanism 70a, and an exhaust mechanism 80.

The film forming container 60 may be the same as that of the first embodiment.

The supply mechanism 70a includes a raw material gas supply unit 71 and an injector 72a installed within the film forming container 60. The injector 72a includes a supply pipe 73a. The raw gas supply unit 71 is connected with the supply pipe 73a of the injector 72a.

In the present embodiment, a second raw material gas supply unit is not provided, and only the first raw material gas supply unit 71a is provided. Also, only the first raw material gas supply unit 71a is connected with the injector 72a (supply pipe 73a).

The exhaust mechanism 80 and the controller 90 may be the same as those of the first embodiment.

In the present embodiment, the controller 90 controls the supply mechanism 70a and the exhaust mechanism 80 to supply the raw material gas by the supply mechanism 70a and, at the same time, exhaust the gas by the exhaust mechanism 80. Further, the supply holes 75 and the exhaust holes 83 are formed to face each other with the wafers W maintained in the boat 44 interposed therebetween. Thus, the raw material gas can be supplied as a laminar flow to the surface of the wafer W while the supply amount is controlled to be constant. Accordingly, the film formation rate within the plane of a wafer W can become uniform, and thus, the film thickness and film quality within the plane of the wafer W can become uniform.

Further, in the present embodiment, the plurality of supply holes 75 and the plurality of exhaust holes 83 are also formed at certain intervals such that they face each other with the wafers W maintained in the boat 44 interposed therebetween, respectively. Thus, the raw material gas can be supplied as a laminar flow to the surface of the respective wafers W while supplying a uniform amount of raw material gas. Accordingly, the film formation rate of each of the plurality of wafers W can become uniform, and the film thickness and film quality of the film formed on the respective wafers W can become uniform.

Third Embodiment

A film forming apparatus according to a third embodiment of the present disclosure will now be described with reference to FIGS. 25 and 26.

A film forming apparatus 10b according to the present embodiment is different from the film forming apparatus 10 according to the first embodiment, in that the film forming apparatus 10b processes wafers W one by one. Also, like the film forming apparatus 10 according to the first embodiment, the film forming apparatus 10b according to the present embodiment may have a loading table (load port) 20 and a housing 30.

The film forming apparatus 10b includes a film forming container 60a, a supply mechanism 70, an exhaust mechanism 80, and a controller 90.

Figure 25:
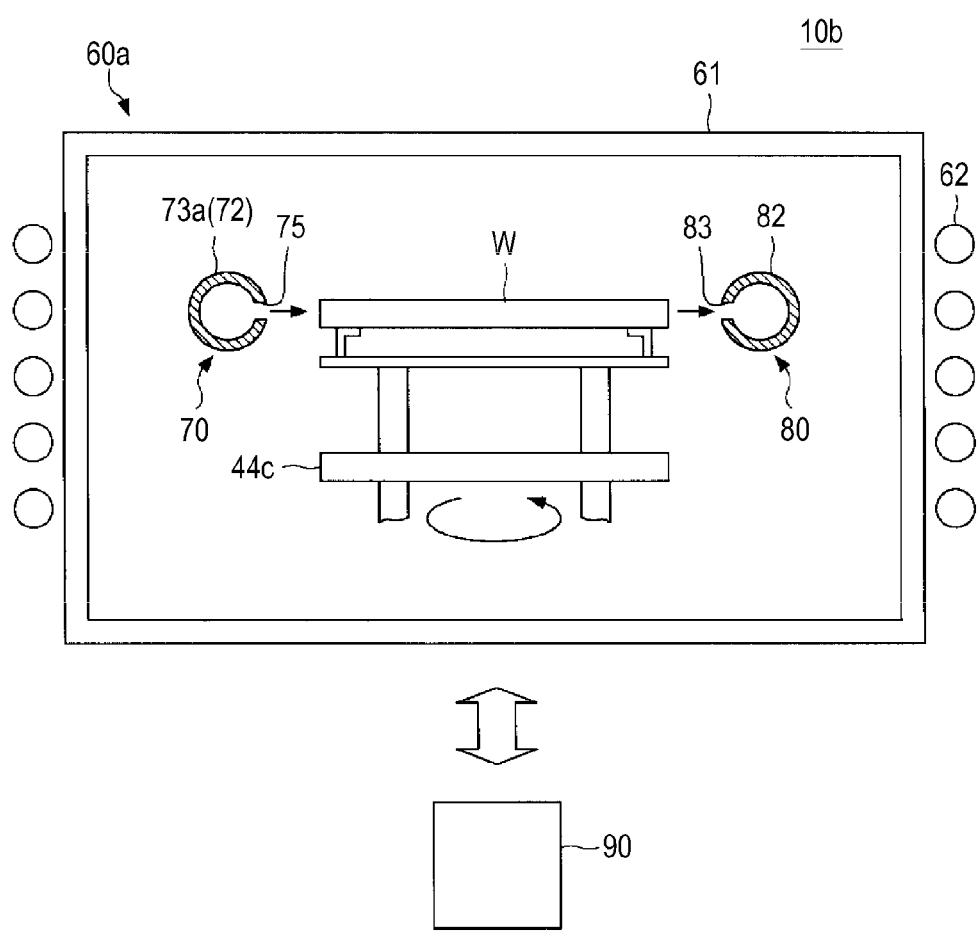
FIG. 25 is a front view showing a configuration of a film forming container, a supply mechanism, an exhaust mechanism, and a controller according to a third embodiment.

FIG. 25 is a front view showing a configuration of the film forming container 60a, the supply mechanism 70, the exhaust mechanism 80, and the controller 90. And, FIG. 26 is a plan view showing a portion of the configuration illustrated in FIG. 25.

The film forming container 60a includes a reaction chamber 61, a heater (heating device) 62, and a substrate maintaining unit 44c.

The substrate maintaining unit 44c is capable of maintaining a wafer W and is also installed such that it can be rotated. Meanwhile, the substrate maintaining unit 44c is installed to maintain one sheet of a wafer W.

The supply mechanism 70 includes a first raw material gas supply unit 71a, a second raw material gas supply unit 71b, and an injector 72. The first raw material gas supply unit 71a and the second raw material gas supply unit 71b may be the same as those of the first embodiment.

The injector 72 includes a supply pipe 73a and an inner supply pipe 73b. The raw material gas supply unit 71 is connected with the supply pipe 73a of the injector 72. Except that the supply pipe 73a and the inner supply pipe 73b are installed to extend in a horizontal direction, they may be the same as the injector 72 according to the first embodiment. The supply pipe 73a has a plurality of supply holes 75 formed thereon. The opening 76 is formed in the vicinity of an end portion of a downstream side of the inner supply pipe 73b in order to supply the first raw material gas to the inner space of the supply pipe 73a.

Figure 26:
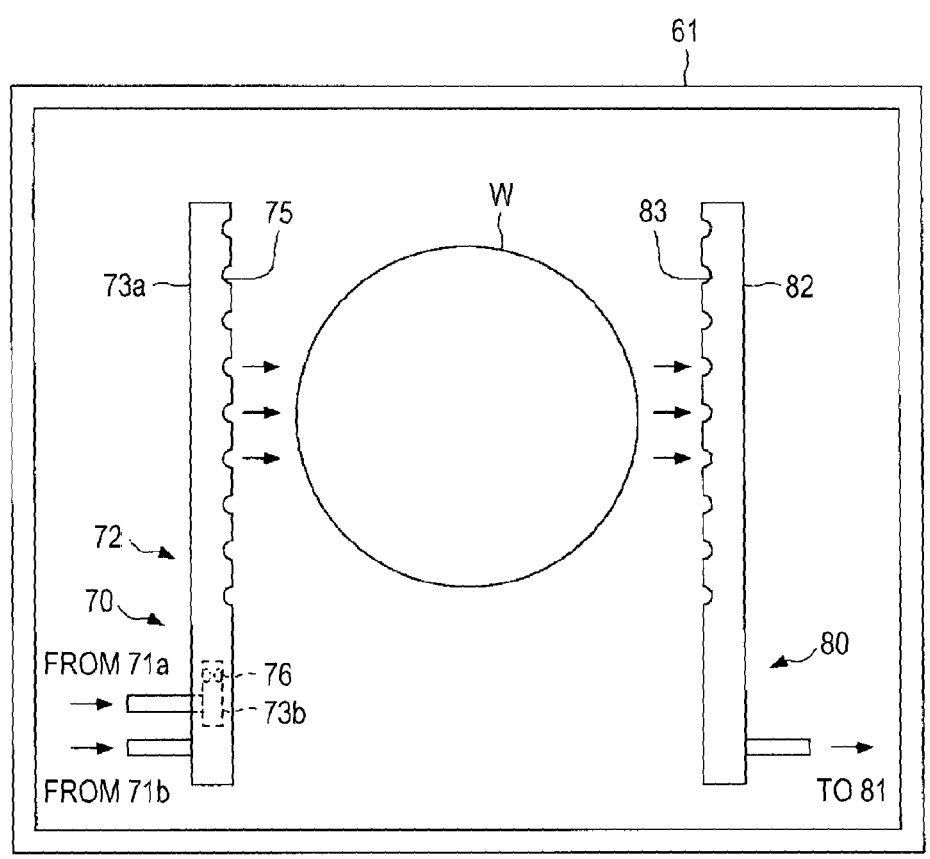
FIG. 26 is a plan view showing a portion of the configuration illustrated in FIG. 25.

Also, FIG. 26 shows an example in which the first raw material gas is supplied from the first raw material gas supply unit 71a to the inner supply pipe 73b and the second raw material gas is supplied from the second raw material gas supply unit 71b to the supply pipe 73a. However, the first raw material gas may be supplied to the supply pipe 73a, and the second raw material gas may be supplied to the inner supply pipe 73b.

The exhaust mechanism 80 includes an exhaust device 81 and an exhaust pipe 82 installed within the film forming container 60a. Except that the exhaust pipe 82 is installed to extend in a horizontal direction, the exhaust pipe 82 may be the same as the exhaust pipe 82 according to the first embodiment. The exhaust pipe 82 has a plurality of exhaust holes 83 formed thereon.

The controller 90 may be the same as that according to the first embodiment.

Also, in the present embodiment, the plurality of supply holes 75 and the plurality of exhaust holes 83 are formed at certain intervals such that they face each other with the wafers W maintained in the substrate maintaining unit 44c interposed therebetween, respectively. Further, the controller 90 controls the supply mechanism 70 and the exhaust mechanism 80 to supply the raw material gas by the supply mechanism 70 and, at the same time, exhaust the gas by the exhaust mechanism 80. In addition, the controller 90 can provide control to flow the first raw material gas formed as, for example, a PMDA gas, at the preset first flow rate F1, and flow the second raw material gas formed as, for example, an ODA gas, at the preset second flow rate F2, while adjusting the concentration of the raw material gases supplied to the entirety of the supply holes 75 to be uniform. Also, the controller 90 may control the exhaust volume of the gases exhausted to the exhaust pipe 82 to be consistent throughout the entirety of the exhaust holes 83. Thus, in a state in which the first and second raw material gases are mixed in a certain mixture ratio, the first and second raw material gases can be supplied as a laminar flow to the surface of the wafer W while the supply amount is controlled to be constant. Accordingly, the film formation rate within the plane of the wafer W can become uniform, and thus, the film thickness and film quality within the plane of the wafer W can become uniform.

According to the present disclosure, in some embodiments, it is possible to provide uniform film quality by supplying a uniform amount of raw material gases within a plane of a substrate.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A film forming apparatus for forming a film on a substrate maintained within a film forming container by supplying first and second raw material gases to the substrate, the apparatus comprising:

a substrate maintaining unit configured to rotatably maintain the substrate within a horizontal plane within the film forming container;

a supply mechanism configured to include an outer supply pipe with supply holes that are formed on a first part of the outer supply pipe and also configured to include an inner supply pipe having one end accommodated within the outer supply pipe and another end placed outside the outer supply pipe;

an exhaust mechanism installed within the film forming container, and configured to include an exhaust pipe with exhaust holes formed thereon to exhaust gas from the interior of the film forming container through the exhaust holes; and a controller configured to control the substrate maintaining unit, the supply mechanism, and the exhaust mechanism, wherein the supply holes and the exhaust holes are formed to face each other with the substrate maintained in the substrate maintaining unit interposed therebetween, wherein the controller provides control to form a film on the substrate by supplying the first and the second raw material gases by the supply mechanism and, at the same time, exhausting the gas by the exhaust mechanism in a state in which the substrate maintained in the substrate maintaining unit is rotated, wherein the first raw material gas flows via the outer supply pipe in a direction from an outside supply unit to the supply holes at a preset first flow rate;

wherein the film is formed on the substrate by supplying, through each of the supply holes, the first and the second raw material gases in a mixed state at a substantially uniform mixture ratio to the substrate maintained within the film forming container, wherein the inner pipe having peripheral openings on the one end, from which the second raw material gas flowing in the inner pipe from the another end to the one end at a preset second flow rate enters the outer supply pipe to join and be mixed with the first raw material gas, wherein, with respect to the direction of the flow of the first raw material gas, the one end of the inner pipe is placed in an upstream side before the first part of the outer supply pipe by a distance that allows the first and the second raw material gases to be substantially uniformly mixed within the outer supply pipe before reaching the supply holes.

2. The apparatus of claim 1, wherein the substrate maintaining unit maintains a plurality of substrates at certain maintaining intervals in a vertical direction, both the outer supply pipe and the exhaust pipe are installed to extend in the vertical direction, a plurality of supply holes are formed on the outer supply pipe, a plurality of exhaust holes are formed on the exhaust pipe, and the plurality of supply holes and the plurality of exhaust holes are formed to face each other at certain intervals with the substrates maintained in the substrate maintaining unit interposed therebetween, respectively.

3. The apparatus of claim 2, wherein the plurality of exhaust holes are formed on the exhaust pipe such that the hole diameter of each of the exhaust holes is reduced toward a downstream side from an upstream side.

4. The apparatus of claim 2, wherein the substrate maintaining unit maintains the plurality of substrates in the vertical direction such that rear surfaces of vertically neighboring substrates face each other or surfaces of vertically neighboring substrates face each other, and the interval between two sheets of the vertically neighboring substrates with the rear surfaces thereof facing each other is narrower than the interval between two sheets of the vertically neighboring substrates with the surfaces thereof facing each other.

5. The apparatus of claim 4, wherein the substrate maintaining unit has a blocking member configured to block a gap between two sheets of the vertically neighboring substrates with rear surfaces thereof facing each other.

6. The apparatus of claim 1, wherein the opening faces a direction different from the direction of the supply holes when viewed from the section perpendicular to the direction in which the outer supply pipe extends.

* * * * *